(12) United States Patent
Murakami et al.

(10) Patent No.: US 7,803,660 B2
(45) Date of Patent: *Sep. 28, 2010

(54) METHOD OF MANUFACTURING SEMICONDUCTOR DEVICE

(75) Inventors: Fumio Murakami, Kodaira (JP); Kenichi Imura, Higashiyamato (JP); Makoto Araki, Ome (JP)

(73) Assignee: Renesas Electronics Corporation, Kanagawa (JP)

( * ) Notice: Subject to any disclaimer, the term of this patent is extended or adjusted under 35 U.S.C. 154(b) by 107 days.

This patent is subject to a terminal disclaimer.

(21) Appl. No.: 12/330,739

(22) Filed: Dec. 9, 2008

(65) Prior Publication Data

US 2009/0093087 A1  Apr. 9, 2009

Related U.S. Application Data

(63) Continuation of application No. 11/213,771, filed on Aug. 30, 2005, now Pat. No. 7,465,609.

(30) Foreign Application Priority Data

Aug. 31, 2004  (JP)  ............................... 2004-251885

(51) Int. Cl.
    *H01L 21/00* (2006.01)
(52) U.S. Cl. ...................... 438/107; 438/114
(58) Field of Classification Search ......... 438/455–463, 438/106–127
    See application file for complete search history.

(56) References Cited

U.S. PATENT DOCUMENTS

| 6,596,561 | B2 | 7/2003 | Takahashi et al. |
| 6,764,878 | B2 | 7/2004 | Fujisawa et al. |
| 6,872,597 | B2 | 3/2005 | Takahashi et al. |
| 7,015,069 | B2 | 3/2006 | Takahashi et al. |
| 7,056,770 | B2 | 6/2006 | Uragami et al. |
| 7,371,606 | B2 * | 5/2008 | Ujiie et al. ................. 438/106 |
| 2002/0025607 | A1 | 2/2002 | Danno et al. |
| 2003/0205797 | A1 | 11/2003 | Takahashi et al. |
| 2006/0091516 | A1 | 5/2006 | Matsunami |

FOREIGN PATENT DOCUMENTS

JP  2001-223229  8/2001

* cited by examiner

*Primary Examiner*—Savitri Mulpuri
(74) *Attorney, Agent, or Firm*—Antonelli, Terry, Stout & Kraus, LLP.

(57) ABSTRACT

In the method of manufacturing a semiconductor device that semiconductor chips are mounted facing-up on the printed wiring board on which a protective insulation film is formed by means of a film-like resist and a plurality of the semiconductor chips are collectively molded by a transfer mold technology, when transfer molding is performed, among the adsorption face of the printed wiring board and the lower die to make adsorb the printed wiring board, the through holes reaching the exterior space of the lower die from the vicinity of the end portion opposing the gate to pour mold resin of a mold cavity are formed as many as possible in order to prevent a short circuit and an open circuit by big deformation of a bonding wire connecting an electrode of the semiconductor chip and an conductor pattern of the printed wiring board.

7 Claims, 22 Drawing Sheets

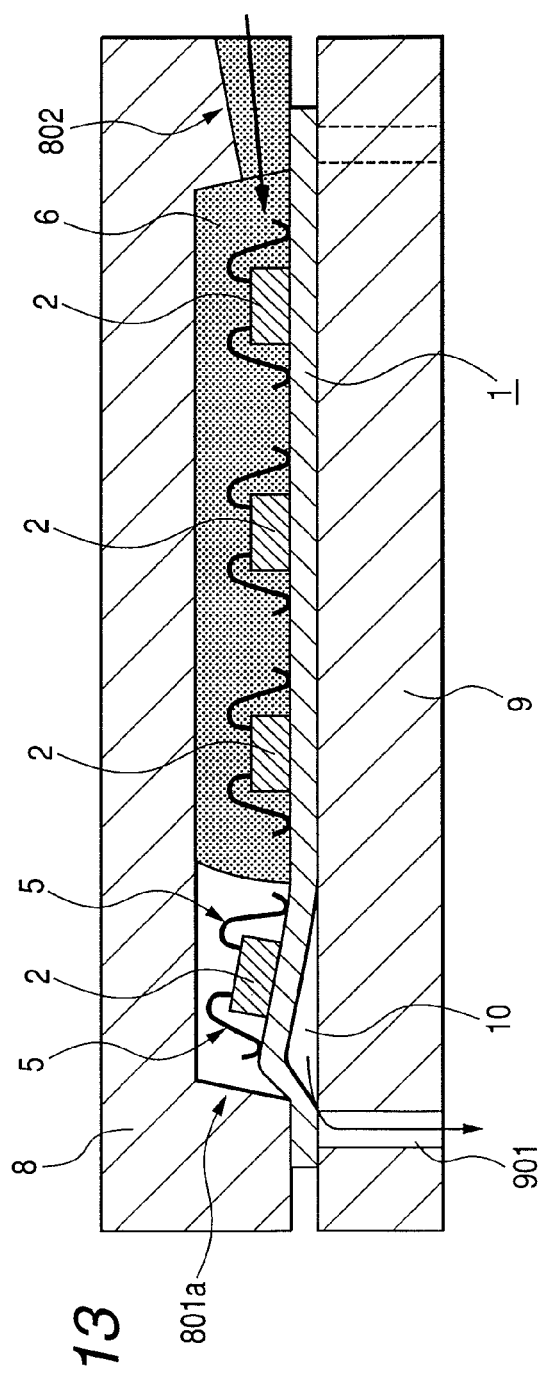
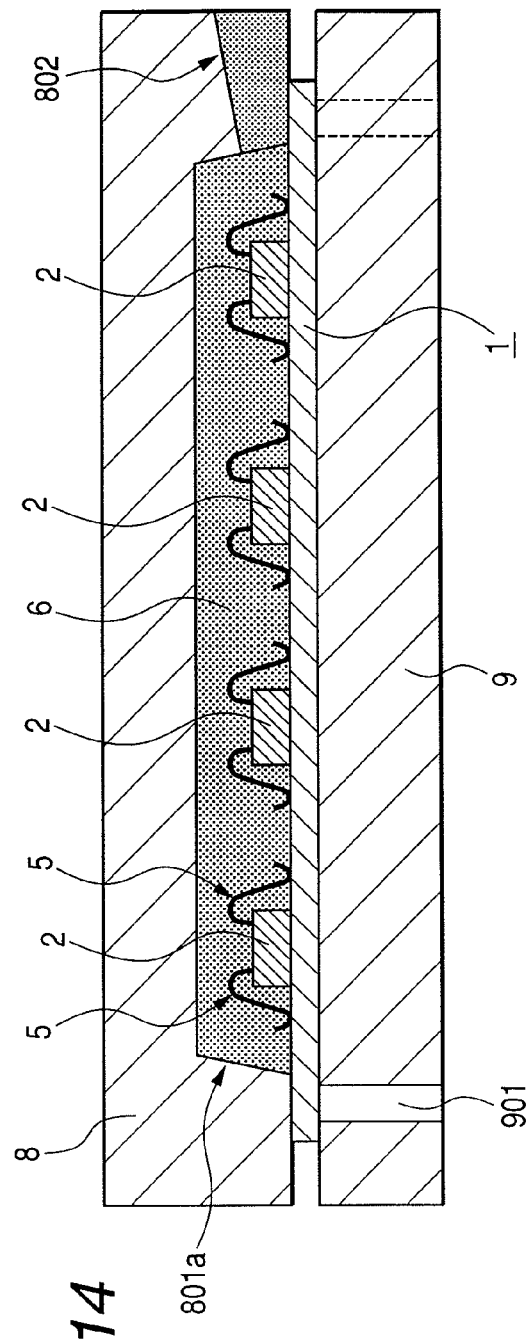

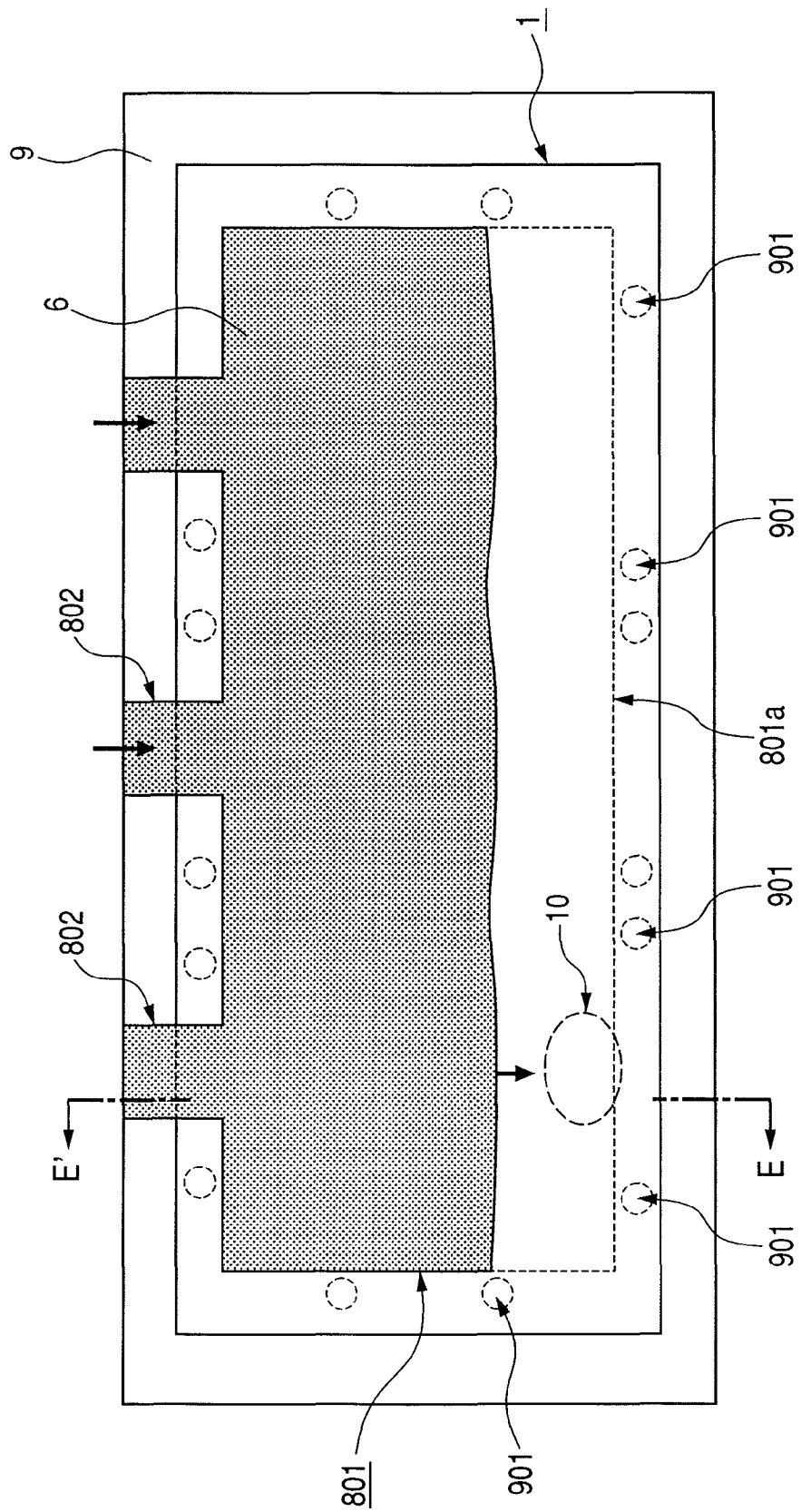

METHOD OF MANUFACTURING SEMICONDUCTOR DEVICE

CONTINUING DATA INFORMATION

The present application is a Continuation application of U.S. application Ser. No. 11/213,771, filed Aug. 30, 2005 now U.S. Pat. No. 7,465,609, the content of which is hereby incorporated by reference into the present application.

FOREIGN PRIORITY DATA INFORMATION

The present application claims priority from Japanese patent application No. 2004-251885 filed on Aug. 31, 2004, the content of which is hereby incorporated by reference into this application.

1. FIELD OF THE INVENTION

The present invention relates to a manufacturing method of a semiconductor device, and particularly relates to an effective technology in the application to manufacture a semiconductor device of the BGA (Ball Grid Array) type or the LGA (Land Grid Array) type electrically connecting an electrode of a semiconductor chip and a conductor pattern of a printing wiring board with a bonding wire, using a printed wiring board (interposer) on which a protective insulation film in a film-like resist is formed.

2. DESCRIPTION OF THE BACKGROUND ART

Conventionally, a semiconductor device using a double-sided printed wiring board whose conductor pattern is also formed on a back surface side of a semiconductor chip mounted surface (hereafter, it is called a chip component side) is one of the semiconductor devices mounting a semiconductor chip on one main surface of the printed wiring board (interposer) providing a conductor pattern and a protective insulation film on a surface of the insulated substrate. Then, a semiconductor device with solder balls electrically connecting said conductor pattern and a conductor pattern of the mounting substrate, upon a conductor pattern of the back surface of a chip mounted surface of the printed wiring board is referred to as BGA. In addition, the semiconductor device electrically and directly connecting a conductor pattern of a back surface of a chip component side of said printing wiring board with a conductor pattern of a mounting substrate is referred to as LGA. Hereafter, when there is no special notice, the semiconductor device in the specification presupposes that it is the semiconductor device using an above double-sided printed wiring board.

In addition, about the double-sided printed wiring board whose conductor pattern was formed on a back surface of a chip component side of said printed wiring board, a conductor pattern of a chip component side and a conductor pattern of a back surface are electrically connected, for example, through a through hole formed in the insulated substrate like a plated through hole or a via hole. Then, generally a protective insulation film is formed on a back surface of a chip component side of said printed wiring board.

In addition, said semiconductor device is classified into a face up type and a face down type (flip-chip type) by means of a direction of a mounted semiconductor chip. Said face up type is the semiconductor device that electrically connects a n electrode of said semiconductor chip and a conductor pattern of said printed wiring board with a bonding wire mounting a non-circuit formation surface, in other words, the back surface of the surface on which the electrode was formed opposing said printed wiring board. On the other hand, about a face down type, an electrode of the semiconductor chip and a conductor pattern of the printed wiring board are electrically connected opposing a circuit formation surface, in other words, the surface on which the electrode was formed against said printed wiring board using bumps (protruding conductors) such as gold or solder provided on electrodes of the semiconductor chip.

When, among said semiconductor devices, face up type semiconductor devices are produced, at first the semiconductor chip is adhered on the printed wiring board, and an electrode of the semiconductor chip and a conductor pattern of the printed wiring board are electrically connected with a bonding wire. Next, mold resin molding the semiconductor chip mounted on the printed wiring board and a bonding wire is formed by a transfer mold technology using a metal mold to the printed wiring board mounting the semiconductor chip. And afterwards, a region becoming a semiconductor device is cut out from the printed wiring board. Then, if the semiconductor device to be produced is the BGA, solder balls are formed on conductor patterns on a back surface of the chip component side before cutting out the portion becoming said semiconductor device.

Then, a metal mold to be used in transfer molding has an upper die with a mold cavity receiving the semiconductor chip arranged on the chip component side of said printed wiring board and a lower die adsorbing the back surface of the chip component side of said printed wiring board. Then, when an outer shape size of a semiconductor device to be produced is small and there is a region to be cut out as a semiconductor device in one piece of a printed wiring board in the manner of two-dimensional grating, about a mold cavity of an upper die, for example, one mold cavity has enough size to be able to receive several semiconductor chips, and the several semiconductor chips are collectively molded in one mold cavity (for example, Japanese Unexamined Patent Publication No. 2001-223229 is referred to).

In late years, a printed wiring board (interposer) to apply to the semiconductor device is getting thinner and thinner. Therefore, as a forming method of the protective insulation film, adoption of a forming method to open a predetermined region by exposure development sticking a resist formed like a film (hereafter, it is called a film-like resist) is being considered. Conventionally, said protective insulation film is generally formed by applying resist and exposure development, but in the case of liquid resist, a thickness on said insulated substrate and a thickness on the conductor pattern become approximately equal. Therefore level difference of protective insulation film at an end portion of a conductor pattern grows big, surface flatness being bad. For example, when a conductor pattern whose membrane thickness is 25 μm is covered by a protective insulation film using liquid resist, a level difference between a surface of a protective insulation film at a portion covering the conductor pattern and a surface of a protective insulation film at a portion formed in a gap between conductor patterns becomes around 5 μm. In addition, since a thickness of a protective insulation film on said conductor pattern becomes approximately the same as the thickness of a protective insulation film on said insulated substrate, it is difficult to make a printed wiring board thinner. In addition, in the case of said liquid resist, with upsizing of the printed wiring board, it becomes difficult to apply it in a uniform thickness to a whole area of a printed wiring board.

On the other hand, in the case of a film-like resist, to make it stick with heat and pressure by means of a roller and the like, there becomes little level difference at an end portion of conductor pattern after it is stuck, thereby it is possible to improve surface flatness. For example, when a conductor pattern of film thickness 25 μm is covered by a protective insulation film formed by sticking with heat and pressure in the manufacturing process using said film-like resist, the level difference of a surface of an insulation film between a portion covering a conductor pattern and a portion formed on a gap between conductor patterns becomes around 0.5 μm. In other words, the level difference of a surface of an insulation film between a portion covering a conductor pattern and a portion formed on a gap between conductor patterns becomes one-tenth of the thickness of a conductor pattern at the maximum. In the case of, in addition, a film-like resist, even if a printed wiring board up-sizes, it is easy to secure homogeneity of a thickness by sticking with heat and pressure. From such a thing, in late years, a protective insulation film of said printed wiring board has a tendency to be formed using said film-like resist.

However, the inventors found that there was a problem that, a bonding wire transforming greatly at the portion near an end portion of a mold cavity opposing the gate side which poured resin into a mold cavity of said metal mold, a short circuit or an open circuit easily happened when a face up type semiconductor device was produced using said printed wiring board on which a protective insulation film was formed with said film-like resist along steps explained by the Background Art.

FIG. 24 through FIG. 26 are mimetic diagrams for explaining the problem in the manufacturing method of a conventional semiconductor device, FIG. 24 is the drawing which looked at the condition of the metal mold of the step molded with mold resin from the chip mounting side, FIG. 25 is a G-G' line sectional view of FIG. 24, and FIG. 26 is a drawing showing the condition of the bonding wire after the molding of area AR3 shown in FIG. 24.

In explaining the above problems concretely, at the time when mold clamping was performed to the printed wiring board mounting said semiconductor chip with an upper die and a lower die in the molding step with said mold resin, the case that semiconductor chips 2 of multiple pieces (4×11) in one mold cavity 801, in other words, a region (product region) PA to be cut out as a semiconductor device is accommodated is given in example, for example, as shown in FIG. 24 and FIG. 25. Then, said mold resin is poured from the gate 802 connecting to one end portion of said mold cavity to the mold cavity 801 as indicated in FIG. 24 and FIG. 25. And the mold resin flowing from up to down on the page in FIG. 24 and from right to left on the page in FIG. 25 proceeds and is stopped pouring at the time when said mold cavity 801 is full with said mold resin, then the mold resin is cured. Then, since the bonding wire connecting with the electrode of the semiconductor chip 2 which is near the end portion of said mold cavity 801 connecting to said gate 802 is hardly transformed, a good semiconductor device is provided. However, the bonding wire 5 connecting with the electrode of the semiconductor device in the vicinity of the end portion 801a opposing to the end portion of said mold cavity 801 connecting to said gate 802, that is to say, at the bottommost part of the page in FIG. 24 and at the leftmost part of the page in FIG. 25, is greatly transformed and contacts with a neighboring other bonding wire 5 as shown in FIG. 26. Since such a semiconductor device becomes defective, as a result, the problem that the manufacturing yield of a semiconductor device falls occurs.

In addition, the above problems can be said as the problems that generally occurs not only in the case that 4×11 semiconductor chips 2 are collectively molded as shown in FIG. 24 and FIG. 25, but also in the manufacturing method of a semiconductor device molding a semiconductor chip by a transfer mold technology, after mounting a semiconductor chip 2 facing up on the printed wiring board on which a protective insulation film is formed using said film-like resist.

SUMMARY OF THE INVENTION

An object of the invention is, in the manufacturing method of a semiconductor device molding a semiconductor chip by a transfer mold technology, after mounting a semiconductor chip facing up on the printed wiring board on which a protective insulation film is formed using said film-like resist, to provide the technique that can prevent a short circuit and an open circuit according to the big change in the shape of a bonding wire connecting an electrode of said semiconductor with a conductor pattern of a printed wiring board.

A manufacturing method of a semiconductor device according to the present invention comprises the steps of: mounting a semiconductor chip on a printed wiring board which is an insulation board on which a conductor pattern and a protective insulation film are formed, and electrically connecting an external electrode of said semiconductor chip with a conductor pattern of said printed wiring board with a bonding wire; molding a semiconductor chip and a bonding wire on said printed wiring board by a transfer mold technology using a metal mold; and individually separating and cutting out a region on which said semiconductor chip is mounted cutting said printed wiring board. A manufacturing method of a semiconductor device according to the present invention uses a printed wiring board on which semiconductor chip mounted surface and back surface conductor patterns are formed, and on which back surface a protective insulation film is formed of a film-like resist. A manufacturing method of a semiconductor device according to the present invention includes a step to mount a semiconductor chip facing up on a printed wiring board on which a protective insulation film is formed using a film-like resist and a step to mold said semiconductor chip by a transfer mold technology.

The first characteristic feature of a manufacturing method of a semiconductor device according to the present invention is that, when mold clamping is performed to said printed wiring board by said metal mold having an upper die with a mold cavity which is arranged on the surface side of said semiconductor chip mounted side of said printed wiring board and a lower die adsorbing the back surface of said semiconductor chip mounted side of said printed wiring board, exhaust holes reaching an exterior space of said lower die from an adsorption face of said back surface of said printed wiring board and said lower die are formed with the interval which is narrower than the pitch of said product region in the vicinity of the end portion opposing the end portion of the gate side through which mold cavity the mold resin is poured and inside an adsorption region in said adsorption region of said back surface of said printed wiring board and said lower die.

Then, in said molding step, for example, a metal mold in a lower die of which exhaust holes adsorbing said back surface of said printed wiring board and said lower die are formed with the interval which is narrower than the pitch of said product region in the vicinity of the end portion opposing the end portion of the gate side through which mold cavity the mold resin is poured and inside an adsorption region in said adsorption region of said back surface of said printed wiring board and said lower die is used.

In addition, instead of forming many exhaust holes of said lower die, before performing said molding step, a groove reaching at least one side of sides of said printed wiring board is formed at the outside of the region which is in the back surface of the surface on which said semiconductor chip is mounted of said printed wiring board and which is cut out in said individually separating step. And one of the sides which the groove formed on the back surface of said printed wiring board reaches being located at the end portion opposing the end portion of the gate side that pours mold resin into said mold cavity, mold clamping may be performed.

Possible cause of a short circuit and an open circuit by the big change in the shape of a bonding wire 5 which is represented in FIG. 26 is, the flatness being high in the surface of the protective insulation film when said printed wiring board is adsorbed by said lower die, air (bubble) which was left behind in an adsorption face of said printed wiring board and a lower die. In other words, air (bubble) left behind in the adsorption face moves to the downstream side end portion of said mold cavity with inflow of mold resin, and reaches said downstream side end portion. Afterwards, since there is no way out, filling of mold resin completes in the condition that the printed wiring board of the portion near to said downstream side end portion is transformed. Therefore, it is thought that, with the change in the shape of the printed wiring board, mold resin cures with the state that a bonding wire connecting with an electrode of the semiconductor chip was greatly transformed and the failure shown in FIG. 26 occurs.

According to the manufacturing method of a semiconductor device of the present invention, as described above, the air that moved to said downstream side end portion can be discharged from said exhaust hole in making there be many exhaust holes in the vicinity of the end portion (downstream side end portion) of said mold cavity opposing the gate to pour mold resin. Therefore, the deformation of a printed wiring board by the air (bubble) when said mold cavity was full with said mold resin can be prevented. Therefore, the big deformation of a bonding wire with the change in the shape of a printed wiring board, connected with an electrode of the semiconductor chip can be prevented. And a short circuit and an open circuit of a bonding wire can be prevented. As a result, the manufacturing yield of the semiconductor device can be improved.

Then, for example, said exhaust hole can be provided in a lower die of said metal mold. Exhaust holes to be used as adsorption of said printed wiring board are conventionally formed in said lower die. However, since adsorption is the purpose in the conventional lower die, the number is few and the space is wide. Therefore, the failure that is represented in FIG. 26 happens when air (bubble) moves to the part where the interval is wide since there is no way out. Then, as mentioned above, in providing as many said exhaust holes as possible, it can be made easy for air (bubble) which moved to said downstream side end portion to run away to an exhaust hole, and big transformation of a bonding wire can be prevented. As for a distance to provide said exhaust holes, by making the space narrower than a pitch of said product region, the inventors found that enough exhaust characteristic ability was provided.

Then, the conventional exhaust holes to apply to adsorption of said printed wiring board are usually formed at the outside of the region where mold resin is formed of said printed wiring board, in other words, in the region in which mold clamping is performed with said upper die and lower die. Therefore, it is thought that air (bubble) which moved to the downstream side end portion of said mold cavity does not arrive at said exhaust hole. Then, by providing said many exhaust holes at the gate side closer to the downstream side end portion of said mold cavity, in other words, in the region of said lower die inside than the part which clamps the wiring board with said upper die and lower die, the air which moved to the downstream side end portion is easy to reach said exhaust hole. Therefore, by making evacuation of air (bubble) left behind at the adsorption face of the printed wiring board and the lower die more ensured, big transformation of a bonding wire can be prevented.

Then, it is preferable for said exhaust holes to be provided at the gate side closer to the downstream side end portion of said mold cavity and between the downstream side end portion of said mold cavity and the end portion nearest to said downstream side end portion of the region (product region) of the printed wiring board to be cut out as a semiconductor device. When said printed wiring board is adsorbed by said lower die, the trace of said exhaust hole is generally left on a protective insulation film of said printed wiring board. Therefore, it is preferred that said exhaust hole is provided in the outside of the region (product region) to be cut out as said semiconductor device.

In addition, if plural semiconductor chips mounted in the manner of two-dimensional grating are received in one mold cavity of said upper die, it is preferred that the interval of said exhaust holes is made narrower than the pitch of the region of said printed wiring board to be cut out as each semiconductor device.

In addition, the manufacturing method of a semiconductor device of the present invention, instead of providing the lower die with many exhaust holes, can also be realized by forming a groove reaching at least one side among the sides of said printed wiring board in the outside of the region cut out in said individually separating step, of the back surface of said semiconductor chip mounted side of said printed wiring board. Then, in the molding step, mold clamping is performed with said metal mold so that one of the sides at which the groove formed on the back surface of said printing wiring board arrives is located at the end portion opposing the end portion of the gate side pouring mold resin into said mold cavity. If it is done in this way, air (bubble) left behind in the adsorption face between said printed wiring board and said lower die reaches said groove on the way moving to the downstream side end portion of said mold cavity, and the air can be discharged through the exhaust hole made of said groove and said lower die.

In addition, if it is before the molding step is performed, the groove of said printed wiring board may be formed in all stages, but it is preferred to be formed before the chip-mounting step, particularly in the exposure development step of the protective insulation film in the production-process of said printed wiring board.

The above and other purposes and new special features of the present invention will become clear in the description of this specification and accompanying drawings.

BRIEF DESCRIPTION OF THE DRAWINGS

FIG. 13 is a mimetic diagram for explaining the operation effect of the manufacturing method of the semiconductor device of First Embodiment, and is a D-D' line sectional view of FIG. 12;

FIG. 14 is a mimetic diagram for explaining the operation effect of the manufacturing method of the semiconductor device of First Embodiment, and is a sectional view showing the condition that the inside of a mold cavity was full of mold resin;

FIG. 15 is a mimetic diagram for explaining the operation effect of the manufacturing method of the semiconductor device of First Embodiment, and is a drawing showing the situation in the mold cavity when pouring in conventional mold resin for comparing with the manufacturing method of First Embodiment;

DETAILED DESCRIPTION OF THE PREFERRED EMBODIMENTS

Figure 1:
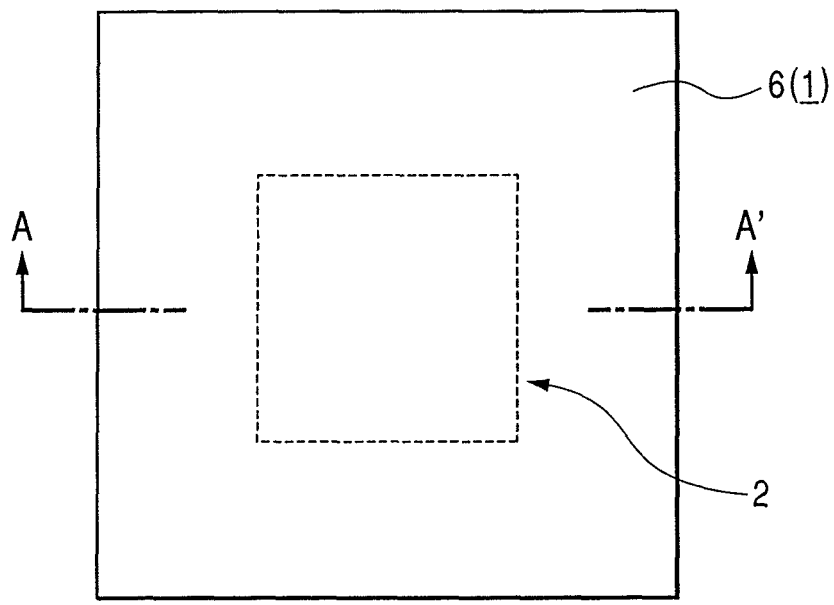
FIG. 1 is a mimetic diagram showing the outline structure of the semiconductor device manufactured by the manufacturing method of the present invention, and is the plan view seen from the semiconductor chip side.

The present invention is explained with detailed description of the preferred embodiment (example) in detail referring to the drawings as follows.

In all the drawings for describing the embodiments, like members of a function will be identified by like reference numerals and overlapping descriptions will be omitted.

In the method of manufacturing a semiconductor device of the present invention, when mold clamping is performed to the printed wiring board mounting semiconductor chips with a metal mold, in mold resin being filled in the mold cavity of the metal mold in the condition that the exhaust holes which can discharge air (bubble) left behind in the adsorption face of the printed wiring board and the lower die to the outside of a metal mold exist in the interval which is smaller than the pitch of the region (hereafter, it is called a product region) to be cut out as a semiconductor device in the printed wiring board, the big change in the shape of a bonding wire with the change in the shape of the printed wiring board by the air (bubble) left behind is prevented.

Figure 2:
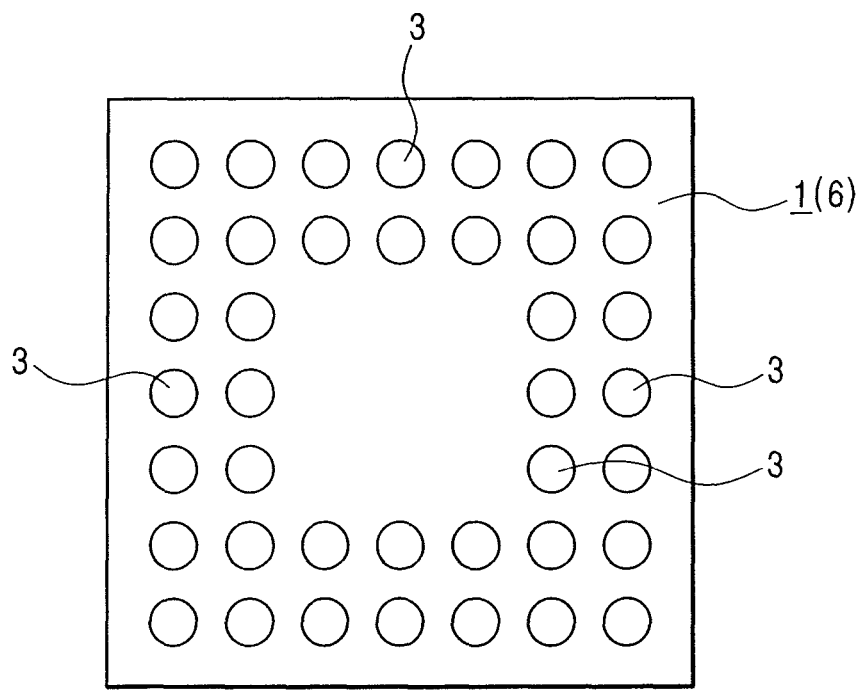
FIG. 2 is a mimetic diagram showing the outline structure of the semiconductor device manufactured by the manufacturing method of the present invention, and is a back view of FIG. 1.
Figure 3:
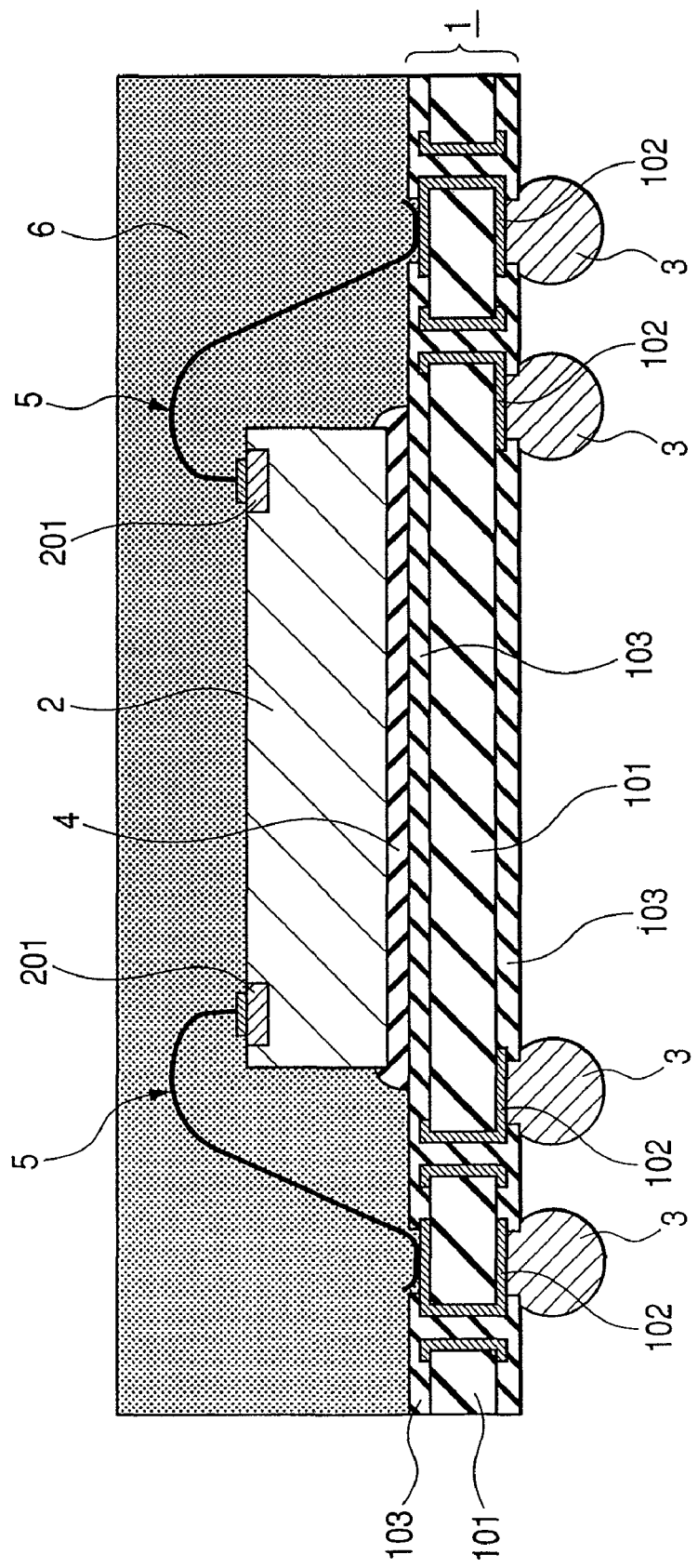
FIG. 3 is a mimetic diagram showing the outline structure of the semiconductor device manufactured by the manufacturing method of the present invention, and is an A-A' line sectional view of FIG. 1.

FIG. 1 through FIG. 3 are mimetic diagrams showing the outline structure of the semiconductor device manufactured by the manufacturing method of the present invention, and FIG. 1 is the plan view seen from the semiconductor chip side, FIG. 2 is a back view of FIG. 1, and FIG. 3 is an A-A' line sectional view of FIG. 1.

In FIG. 1 through FIG. 3, 1 is a printed wiring board, 101 is an insulated substrate, 102 is a conductor pattern, 103 is a protective insulation film, 2 is a semiconductor chip, 201 is an electrode of the semiconductor chip, 3 is a solder ball, 4 is adhesive, 5 is a bonding wire, and 6 is mold resin.

The semiconductor device which a method of manufacturing a semiconductor device of the present invention is applied to and which is produced is, for example, as shown in FIG. 1 through FIG. 3, the semiconductor device mounting a semiconductor chip 2 on one main surface of a printed wiring board (interposer) 1 which is an insulated substrate 101 on which a conductor pattern 102 and a protective insulation film 103 were formed.

Then, as for said printed wiring board 1, as shown in FIG. 3, a conductor pattern 102 is formed on the surface on which said semiconductor chip 2 was mounted (hereafter, it is called a chip mounted surface) and on the back surface of said insulated substrate 101. In addition, a conductor pattern 102 on said chip mounted surface and the back surface is, for example, electrically connected by a plated through hole through an opening portion of said insulated substrate 101. In addition, a conductor pattern 102 on said chip mounted surface and the back surface may be electrically connected with a via hole.

Then, it is assumed that at least a protective insulation film on a back surface of said chip mounted surface among protective insulation films 103 of said printed wiring board 1, is formed using a film-like resist passing through a thermocompression bonding step in a manufacturing process. As thus described, as for the protective insulation film which was formed using a film-like resist and passing through a thermocompression bonding step, the level difference between the part covering a conductor pattern and the part formed in the gap between conductor patterns, is formed in less than a one-tenth of the film thickness of a conductor pattern. Thus, the surface flatness is very high.

In addition, the semiconductor device which is represented in FIG. 1 through FIG. 3 is a semiconductor device as referred to as BGA, and conductor patterns 102 of a back surface of said chip mounted surface of said printed wiring board 1 are formed in an array manner as shown in FIG. 2, and on each conductor pattern 102, solder balls 3 to connect with conductor patterns of the mounted substrate (circuit board) are attached. In addition, though, here, a semiconductor device as referred to as the BGA of which solder balls 3 are attached on conductor patterns 102 of the back surface of said chip mounted surface, is given in example as shown in FIG. 2 and FIG. 3, a semiconductor device as referred to as LGA which does not attach solder balls 3 can also be produced applying the manufacturing method of a semiconductor device of the present invention.

A semiconductor chip 2 mounted on, in addition, said printed wiring board 1 is, as shown in FIG. 3, adhered with adhesive 4 opposing a non-circuit formation surface, in other words, a back surface of the surface in which an electrode 201 was formed against said printed wiring board 1. And, an electrode 201 of said semiconductor chip 2 and a conductor pattern 102 of said printed wiring board 1 are electrically connected by a bonding wire 5.

In the chip mounted surface side of, in addition, said printed wiring board 1, mold resin 6 which molds a semiconductor chip 2 and bonding wires 5 and equalizes external dimensions, is formed.

Figure 4:
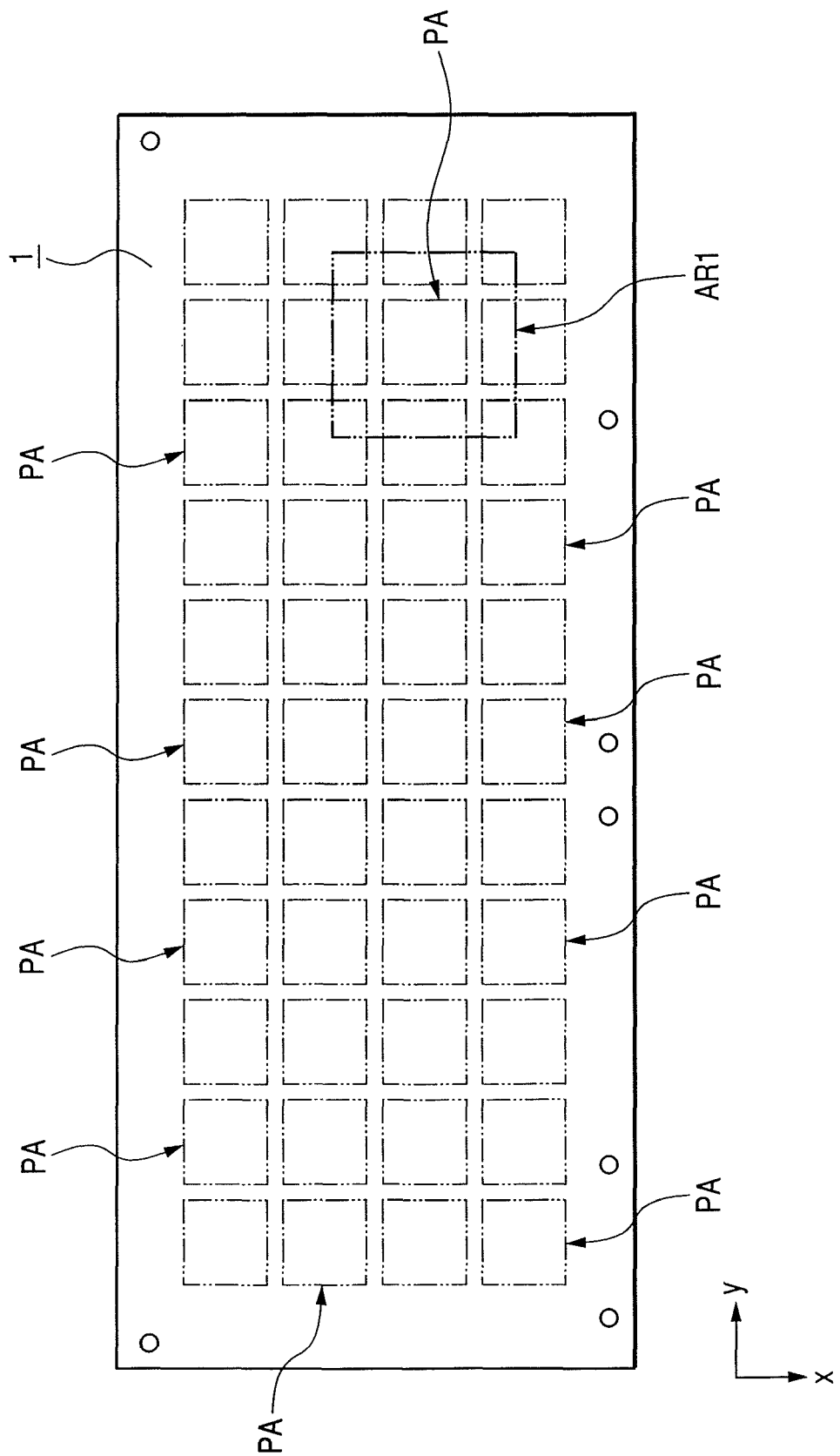
FIG. 4 is a mimetic diagram for explaining the rough procedure of the manufacturing method of the semiconductor device of the present invention, and is the drawing which looked at the printed circuit board used for manufacture of a semiconductor device from the chip mounting surface.
Figure 5:
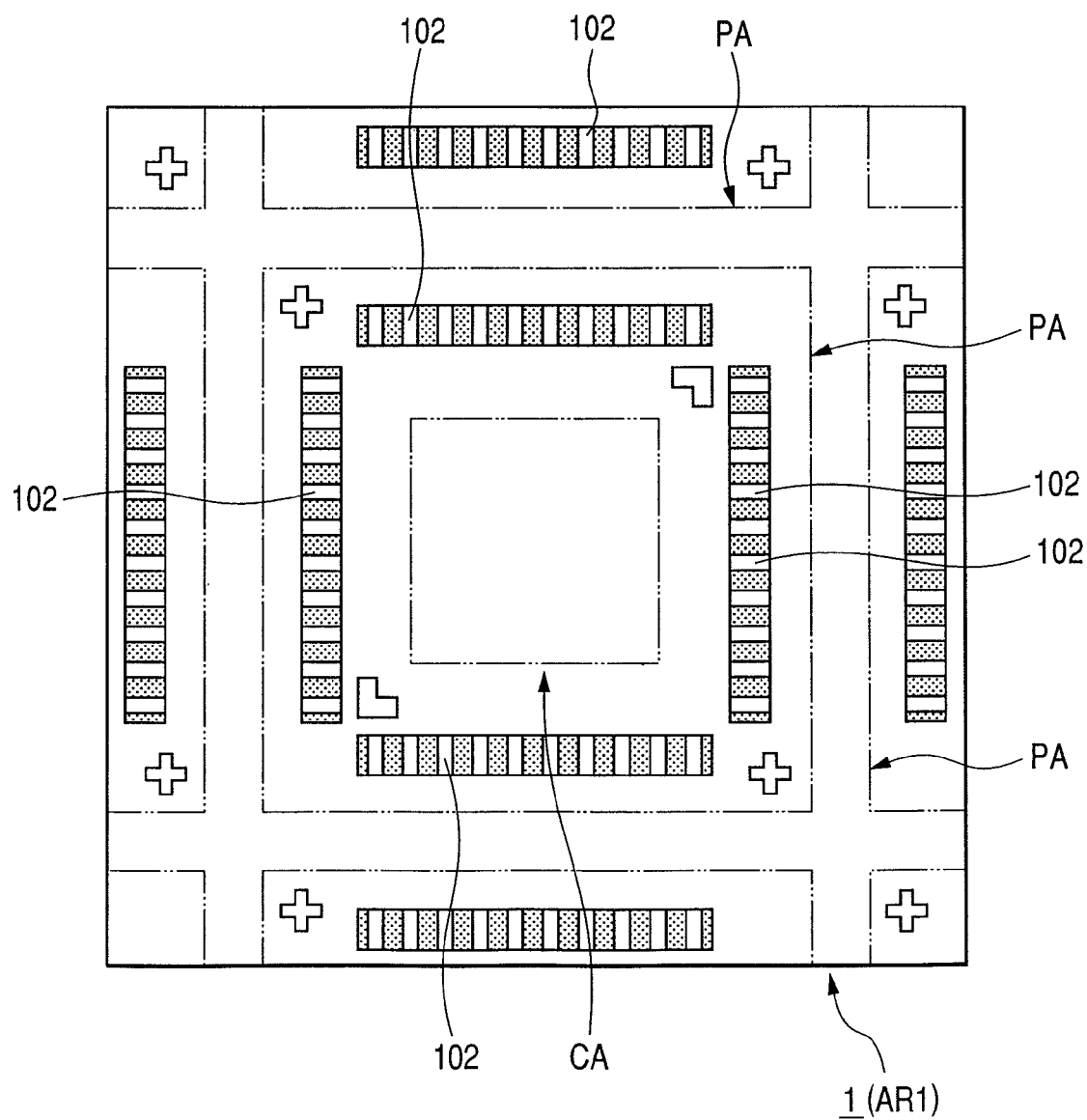
FIG. 5 is a mimetic diagram for explaining the rough procedure of the manufacturing method of the semiconductor device of the present invention, and is an enlarged view of area AR1 of FIG. 4.
Figure 6:
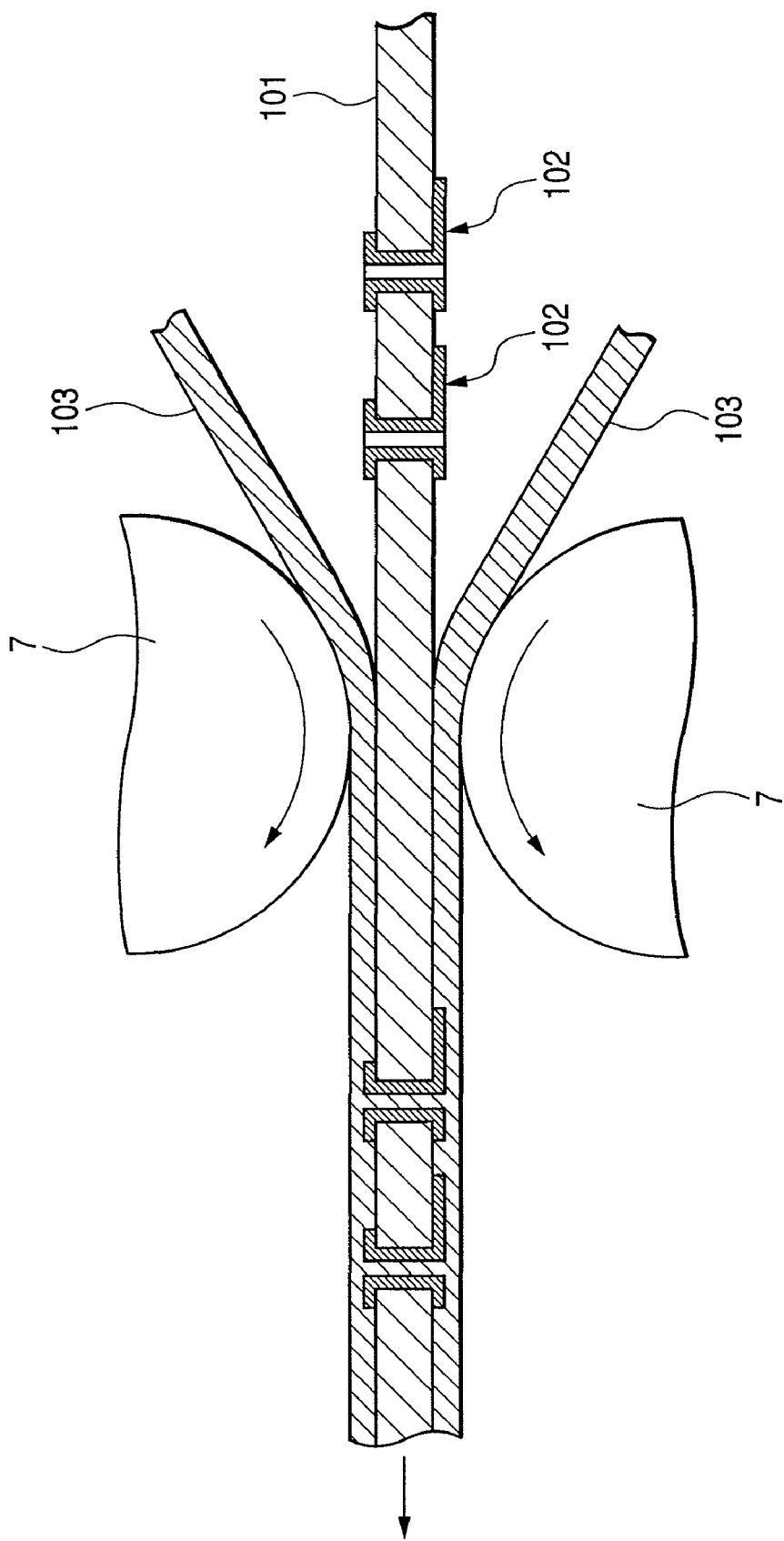
FIG. 6 is a mimetic diagram for explaining the rough procedure of the manufacturing method of the semiconductor device of the present invention, and is a drawing explaining the formation method of a protective insulation film.
Figure 7:
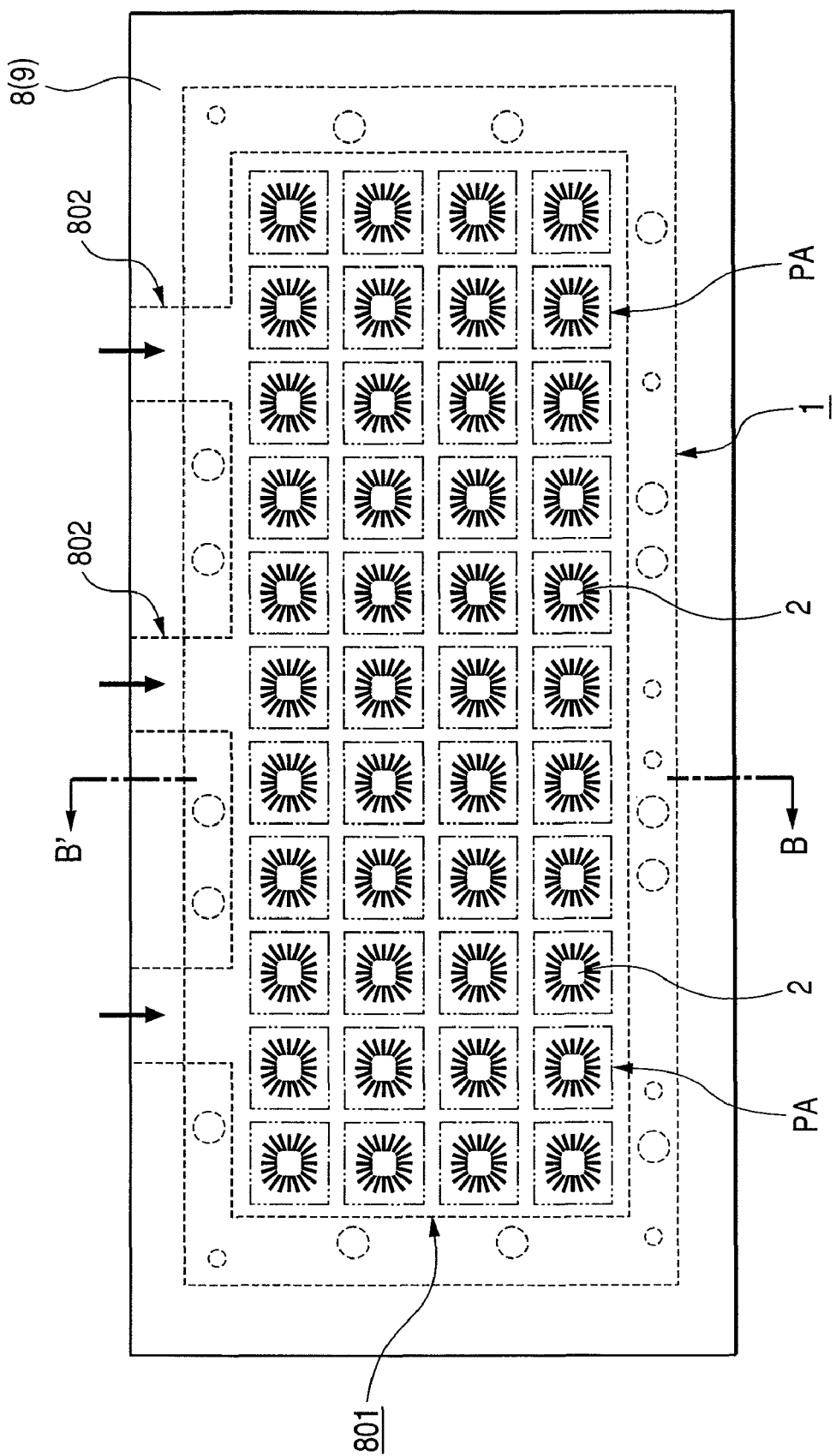
FIG. 7 is a mimetic diagram for explaining the rough procedure of the manufacturing method of the semiconductor device of the present invention, and is the drawing which looked at the condition of having mold clamping performed to the printed circuit board which mounted the semiconductor chip with the metal mold, from the chip mounting surface side.
Figure 8:
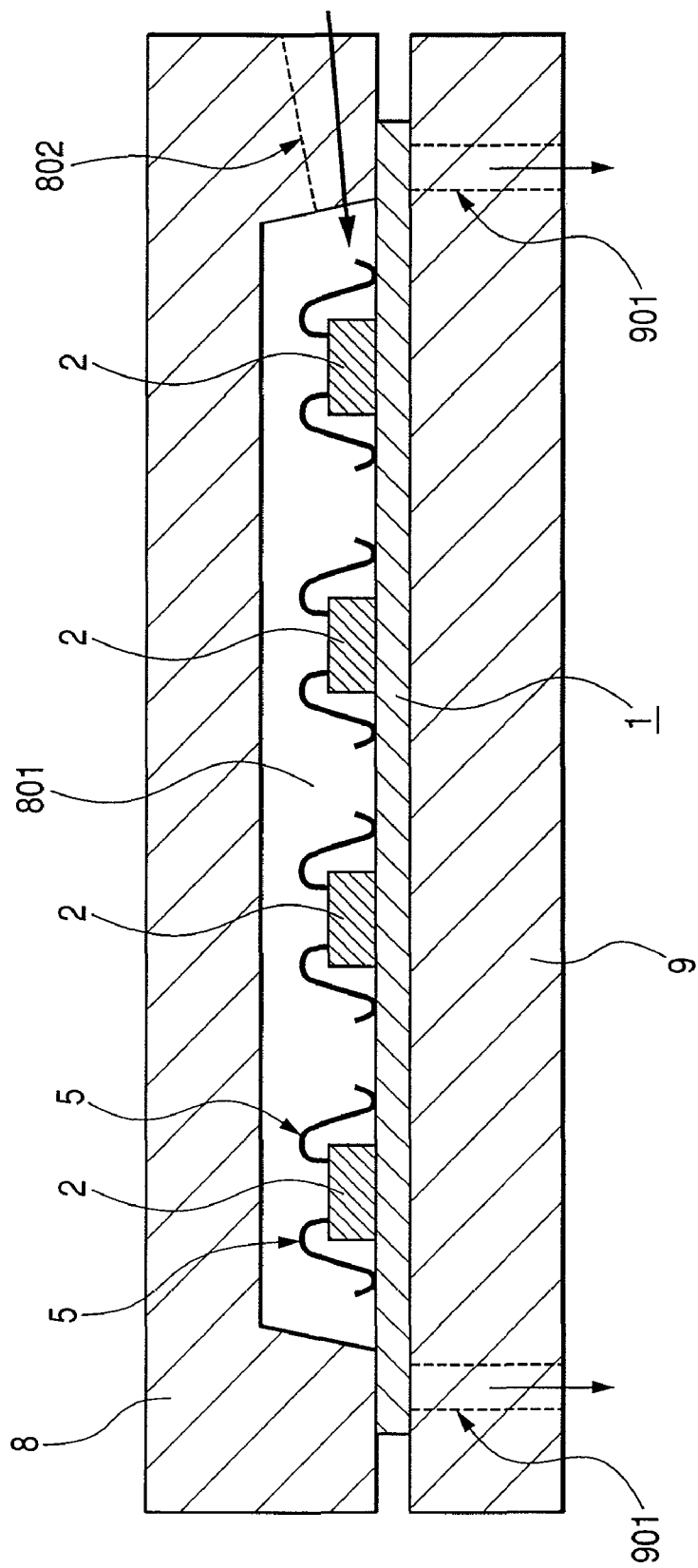
FIG. 8 is a mimetic diagram for explaining the rough procedure of the manufacturing method of the semiconductor device of the present invention, and is a B-B' line sectional view of FIG. 7.

FIG. 4 through FIG. 8 are mimetic diagrams for explaining the rough procedure of the manufacturing method of the semiconductor device of the present invention, FIG. 4 is the drawing which looked at the printed circuit board used for manufacture of a semiconductor device from the chip mounting surface, FIG. 5 is an enlarged view of area AR1 of FIG. 4, FIG. 6 is a drawing explaining the formation method of a protective insulation film, FIG. 7 is the drawing which looked at the condition of having mold clamping performed to the printed circuit board which mounted the semiconductor chip with the metal mold, from the chip mounting surface side, and FIG. 8 is a B-B' line sectional view of FIG. 7.

In FIG. 4 through FIG. 8, PA is a region to be cut out as a semiconductor device (product region), CA is a chip mounted region, 7 is a roller, 8 is an upper die, 801 is a mold cavity, 802 is a gate, 801a is downstream side end portion of a mold cavity, 9 is a lower die, and 901 is an exhaust hole.

In the manufacturing method of a semiconductor of the present invention, at first, as shown in FIG. 4 and FIG. 5, a printed wiring board 1 is prepared. In addition, here, as an example, the printed wiring board 1 which has a region (product region) PA to be cut out as a semiconductor device of 4 in x direction and of 11 in y direction, is represented. Then, in each said product region PA, for example, as shown in FIG. 5, in the outside of the region CA on which a semiconductor chip is mounted (adhered), conductor patterns 102 electrically connecting with electrodes 201 of a semiconductor chip 2, expose. In addition, illustration and detailed description are omitted, but said conductor pattern 102 connects with a conductor pattern 102 of a back surface of the chip mounted surface by a plated through hole or a via hole.

Since such a printed wiring board 1 can be manufactured using the manufacturing method of a conventional double-sided printed wiring board, detailed description is omitted, and only a generous step is explained.

When said double-sided printed wiring board 1 is manufactured, for example, after having formed a conductor film such as an electrolytic copper foil on the first main surface and the back surface (the second main surface) of an insulated substrate 101, a region determined beforehand is opened, and plating of electroless plating etc. is formed on a first surface of the conductor film and the side of the opening portion. And after having formed said conductor pattern 102 patterning a conductor film of each said main surface, a protective insulation film 103 is formed.

Then, other than the above methods, for example, after having formed a conductor film such as an electrolytic copper foil on one main surface of the insulated substrate 101, via holes are formed by laser etc. from a back surface of the main surface on which the conductor film is formed, and electroless plating film is formed on a back surface of the main surface on which the conductor film is formed and in a via hole. And after having formed a conductor pattern 102 patterning a conductor film of each said main surface, said protective insulation film 103 may be formed.

In addition, for example, as shown in FIG. 6, after resist material 103 beforehand processed in the shape of a film is stuck on each main surface of the insulated substrate 101 with heat and pressure on which a conductor pattern 102 is formed using a roller 7 etc., said protective insulation film 103 is made performing exposure development. Sticking with heat and pressure using a film-like resist and a roller 7 etc., flatness can be improved in the surface of said protective insulation film 103, and thinning of printed circuit board 1 is possible. By passing through such processes, the level difference between the surface of a protective insulation film 103 formed on a conductor pattern 102 and the surface of a protective insulation film 103 formed on the gap between conductor patterns 102, can be made less than one-tenth of the film thickness of a conductor pattern 102 formed on the insulated substrate 101. Thus, the protective insulation film 103 whose surface flatness is very high can be formed. As thus described, by improving the surface flatness of the protective insulation film 103, when a semiconductor chip is mounted through bonding adhesive, forming a void between a semiconductor chip and a protective insulation film can be prevented.

When the semiconductor devices which is represented in FIG. 1 through FIG. 3 are produced using the printed wiring board 1 formed by the above steps, at first, said semiconductor chip 2 is mounted (adhered) on said printed wiring board 1, and then electrodes 201 of said semiconductor chip 2 and conductor patterns 102 of said printed wiring board 1 are electrically connected with bonding wires 5.

Next, as shown in FIG. 7 and FIG. 8, by a metal mold having an upper die 8 arranged on the chip mounted surface side of said printed wiring board 1 and comprising a mold cavity 801 receiving said semiconductor chips 2 and a lower die 9 adsorbing a back surface of the chip mounted surface of said printed wiring board 1, mold clamping is performed to said printing wiring board 1. And, pouring mold resin 6 into the mold cavity 801 from the gate 802 connecting to the mold cavity 801, semiconductor chips 2 and bonding wires 5 are molded. Then, the mold cavity 801 of said upper die 8 is, for example, the nominal size for one mold cavity 801 to be able to accommodate said 4×11 semiconductor chips 2, and collectively molds said 4×11 semiconductor chips 2 and bonding wires 5.

Next, mold resin 6 which was filled in said mold cavity 801 is cured, and taken out from said metal mold, cutting said printed wiring board 1 and mold resin 6 in the region (dicing region) as shown in FIG. 5 separating each said product region PA, the product region PA is individually separated. Then, if a produced semiconductor device is BGA type, before individually separating the product region PA, as indicated in FIG. 2 and FIG. 3, solder balls 3 are attached on the conductor patterns 102 of a back surface of the chip mounted surface of said printed wiring board 1.

The manufacturing method of a semiconductor device of the present invention is, if roughly speaking, the above procedure. As follows, the method to prevent a short circuit and an open circuit by the big change in the shape of a bonding wire 5 in the above manufacturing method of a semiconductor device will be concretely explained.

First Embodiment

Figure 9:
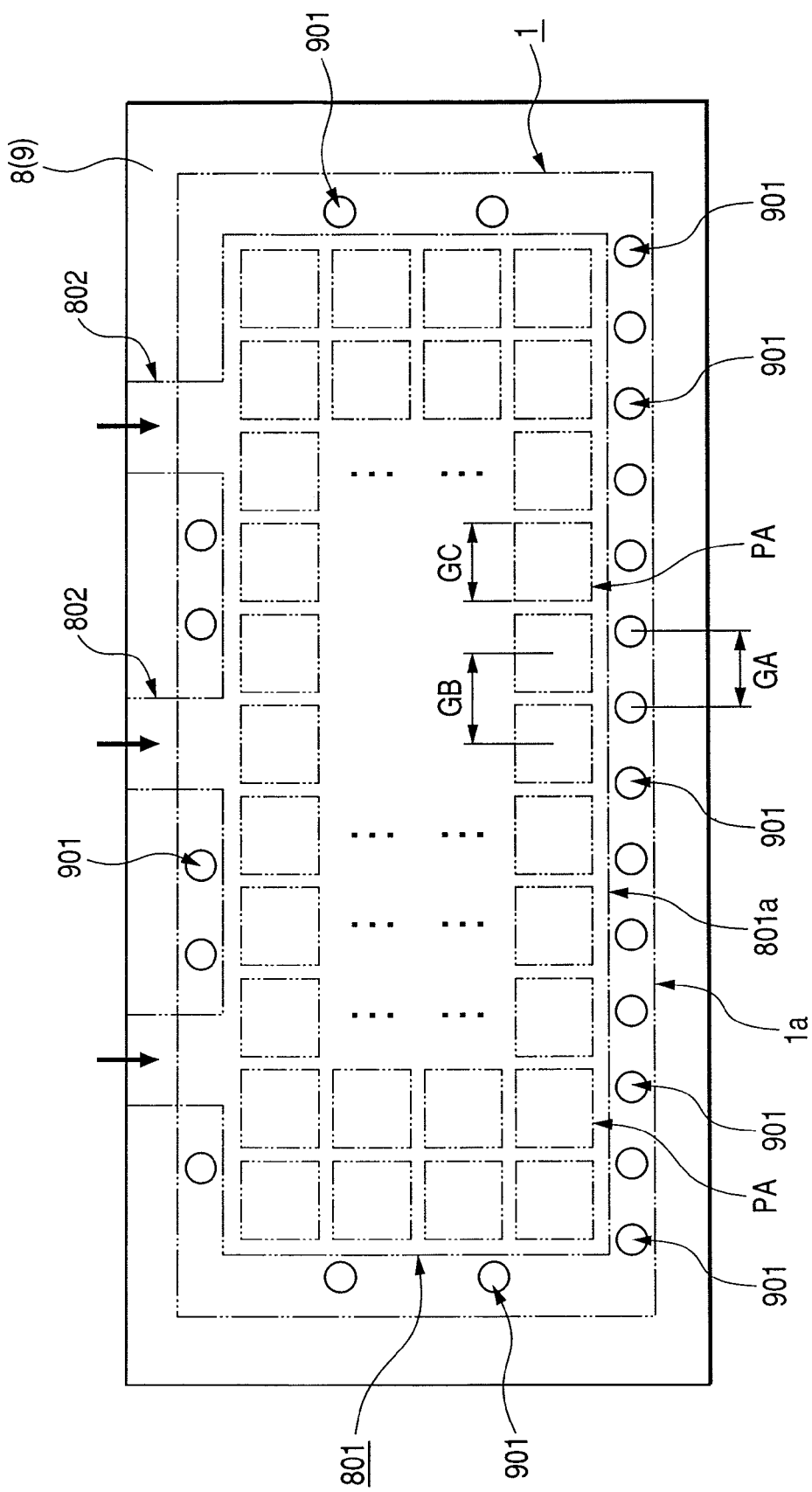
FIG. 9 is a mimetic diagram for explaining the manufacturing method of the semiconductor device of First Embodiment by the present invention, and is the drawing which looked at the lower die of the metal mold used by a molding step from the adsorption face of a printed circuit board.

FIG. 9 is a mimetic diagram for explaining the manufacturing method of the semiconductor device of First Embodiment by the present invention, and is the drawing which looked at the lower die of the metal mold used by a molding step from the adsorption face of a printed circuit board.

In FIG. 9, 801a is a downstream side end portion of a mold cavity, and 901 is an exhaust hole of a lower die.

In the manufacturing method of a semiconductor device of the present First Embodiment, as shown in FIG. 9, among the exhaust holes 901 formed in the lower die 9 to be used when adsorbing the printed wiring board 1, the number of exhaust holes 901 formed along a side 1a of the printed wiring board near the end portion (downstream side end portion) 801a opposing a gate 802 side pouring mold resin into said mold cavity 801, is increased as much as possible. Then, the interval GA of the exhaust holes 901 is preferred so as to be small, and particularly, by making it smaller than an interval GB of the region PA to be cut out as said semiconductor device or the width GC of the region PA to be cut out as said semiconductor device, the inventors found that air could be exhausted well, when it was interposed between the printed wiring board 1 and the lower die 9, by means of an exhaust hole 901. Thus, by means of getting enough exhaust characteristic ability, the defective generation by deformation of bonding wire 5 can be prevented.

Then, since said exhaust hole 901 is generally used for adsorption of said printed wiring board 1, said exhaust hole 901 is usually connected to an evacuation device (it is not illustrated), but as for exhaust holes 901 formed along an edge portion 1a of the printed wiring board of the opposite side against the gate side pouring mold resin into said mold cavity 801, all holes may be connected to the evacuation device, and the hole which is connected to the evacuation device and the hole merely connecting an adsorption face and the exterior space of a lower die may coexist.

Figure 10:
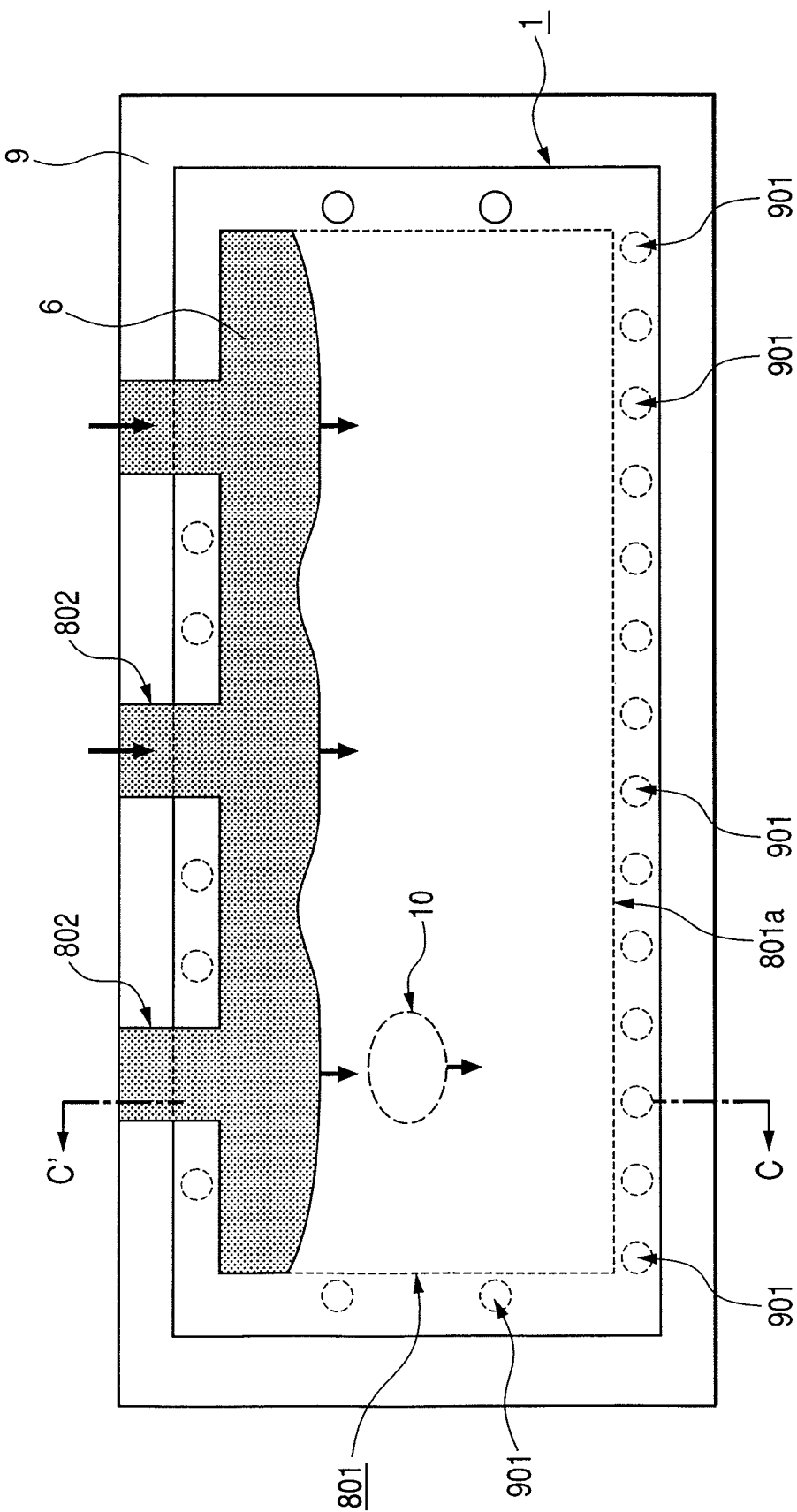
FIG. 10 is a mimetic diagram for explaining the operation effect of the manufacturing method of the semiconductor device of First Embodiment, and is a drawing showing the situation in the mold cavity immediately after inflow initiation of mold resin.
Figure 11:
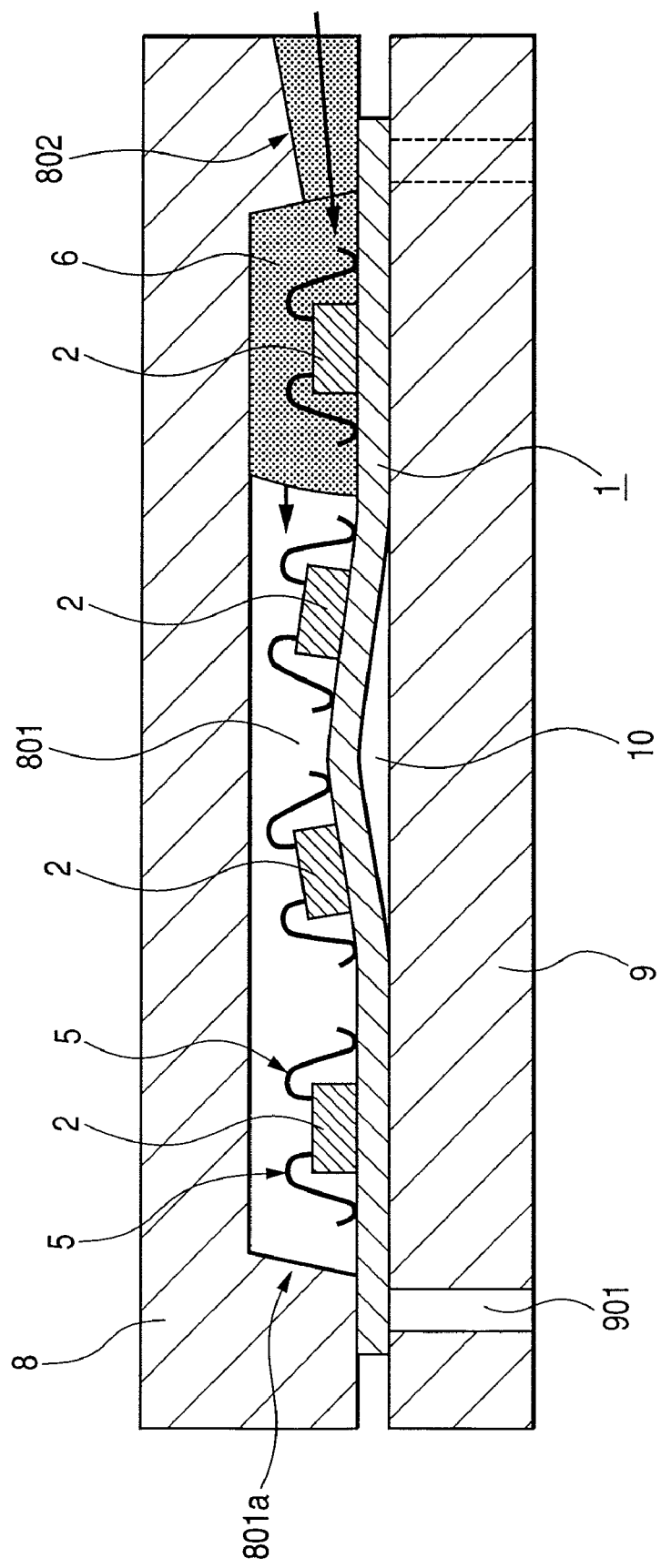
FIG. 11 is a mimetic diagram for explaining the operation effect of the manufacturing method of the semiconductor device of First Embodiment, and is a C-C' line sectional view of FIG. 10.
Figure 12:
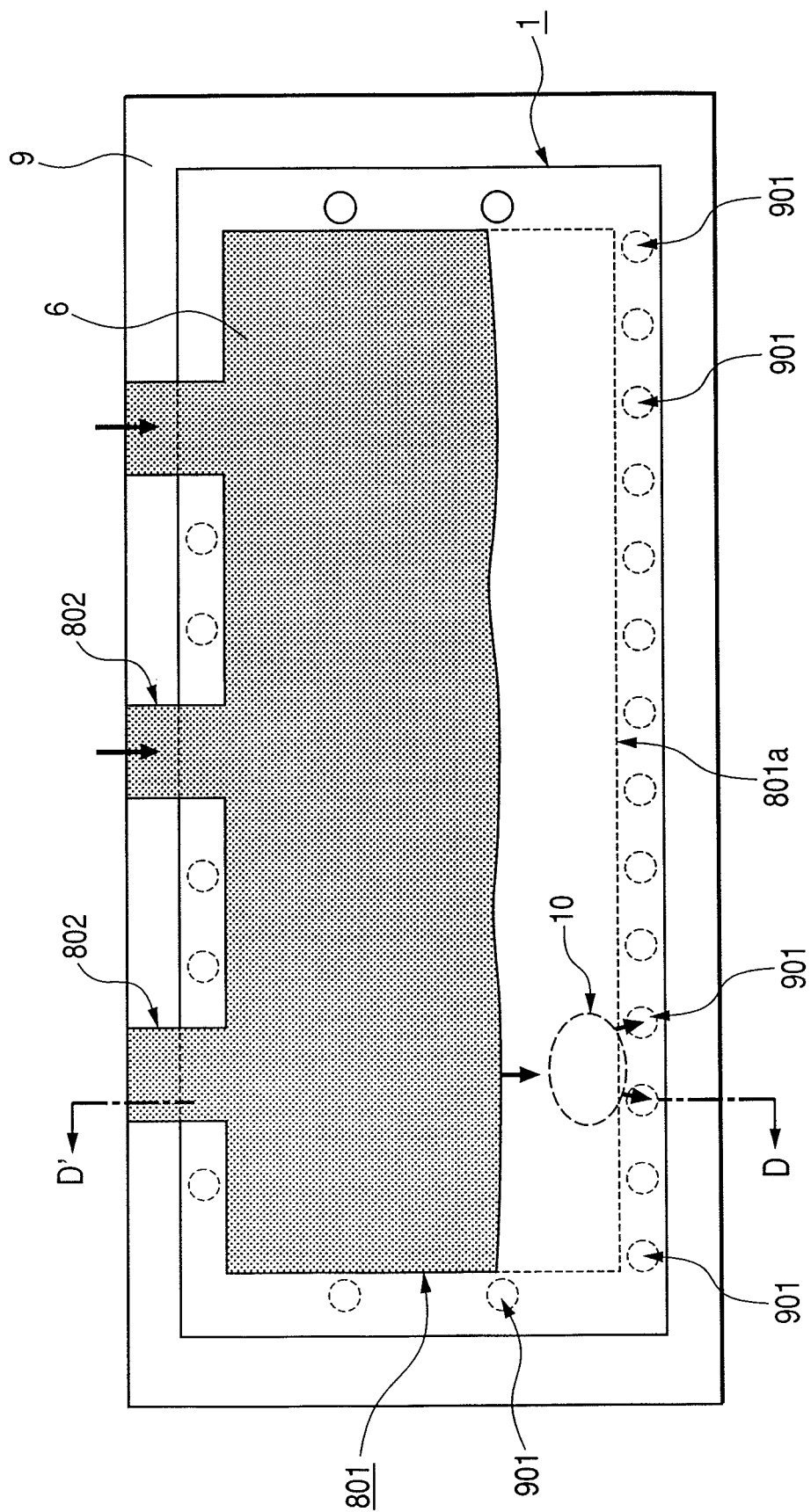
FIG. 12 is a mimetic diagram for explaining the operation effect of the manufacturing method of the semiconductor device of First Embodiment, and is a drawing showing a situation when the air left in the adsorption face of a printed circuit board and a lower die arrives at the end portion of a mold cavity.
Figure 16:
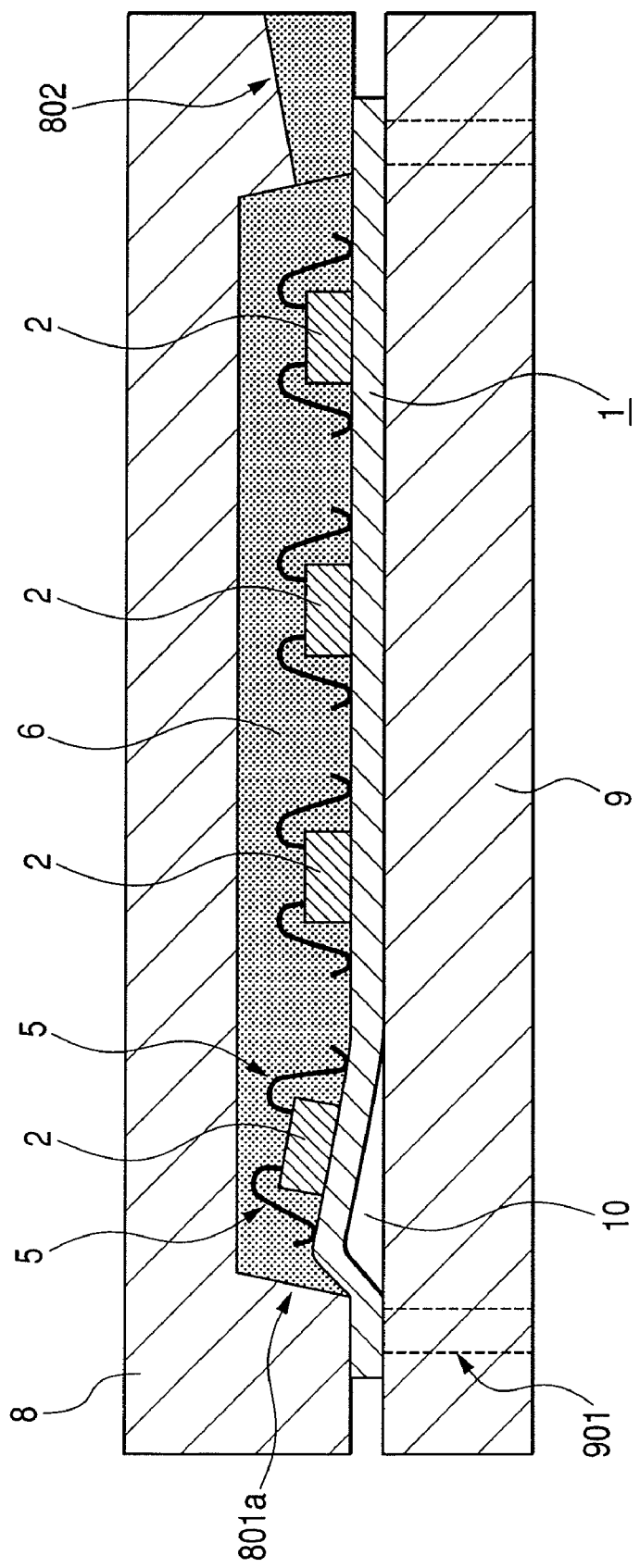
FIG. 16 is a mimetic diagram for explaining the operation effect of the manufacturing method of the semiconductor device of First Embodiment, and is an E-E' line sectional view of FIG. 15.

FIG. 10 through FIG. 16 are mimetic diagrams for explaining the operation effect of the manufacturing method of the semiconductor device of First Embodiment, FIG. 10 is a drawing showing the situation in the mold cavity immediately after inflow initiation of mold resin, FIG. 11 is a C-C' line sectional view of FIG. 10, FIG. 12 is a drawing showing a situation when the air left in the adsorption face of a printed circuit board and a lower die arrives at the end portion of a mold cavity, FIG. 13 is a D-D' line sectional view of FIG. 12, FIG. 14 is a sectional view showing the condition that the inside of a mold cavity was full of mold resin, FIG. 15 is a drawing showing the situation in the mold cavity when pouring in conventional mold resin for comparing with the manufacturing method of First Embodiment, and FIG. 16 is an E-E' line sectional view of FIG. 15.

In the manufacturing method of a semiconductor device of the present First Embodiment, lower die 9 of the metal mold is only made structure as shown in FIG. 9, and since the procedure that mold clamping is performed to the printing wiring board 1 mounting a semiconductor chip 2 with an upper die 8 and a lower die 9 and the procedure that mold resin 6 is poured in the mold cavity 801 and cured, may be the same as the conventional molding step, detailed description on the procedure is omitted.

In the manufacturing method of a semiconductor device of the present First Embodiment, since a protective insulation film 103 of the printed wiring board 1 is, for example, formed by sticking a film-like resist with heat and pressure as indicated in FIG. 6, the flatness is high. Therefore, when mold clamping is performed to the printed wiring board 1 mounting said semiconductor chip 2 with said metal mold and mold resin 6 is poured in the mold cavity 801, for example, as shown in FIG. 10 and FIG. 11, air (bubble) 10 can be left behind in the adsorption face of said printed wiring board 1 and said lower die 9. Then, when mold resin 6 is poured in the mold cavity 801, air (bubble) 10 left behind, as shown in FIG. 12 and FIG. 13, moves to the direction of the end portion (downstream side end portion) 801a opposing the gate side 802 of said mold cavity 801 by inflow pressure of mold resin 6. And, air 10 which arrived at the downstream side end portion 801a, is going to run away to the outside of the downstream side end portion 801a, namely to a region of which mold clamping is performed. However, since said region where the mold clamping is performed is fixed with high pressure so that said mold resin 6 may not ooze, it is rare that said air 10 can outrun said region where the mold clamping is performed and escape to the outside of the metal mold.

However, in the manufacturing method of a semiconductor device of the present First Embodiment, many exhaust holes 901 are formed in the outside of downstream side end portion

801a. Then, if air 10 which is going to escape outward from downstream side end portion 801a, as indicated in FIG. 12, arrives at the exhaust hole 901 at a point of downstream side end portion 801a, said air 10 which arrived can escape to the exterior space of the lower die 9 through the exhaust hole 901. Therefore, as shown in FIG. 14, discharging said air 10 which moved to the downstream side end portion 801a to the outside of the lower die 9, the mold cavity 801 can be filled with said mold resin 6 with the state that said printed wiring board 1 is not transformed by said air (bubble). As a result of this, the phenomenon shown in FIG. 26 that big deformation of a bonding wire 5 happens with the deformation of the printed wiring board 1 which is near to said downstream side end portion 801a, can be prevented.

Figure 26:
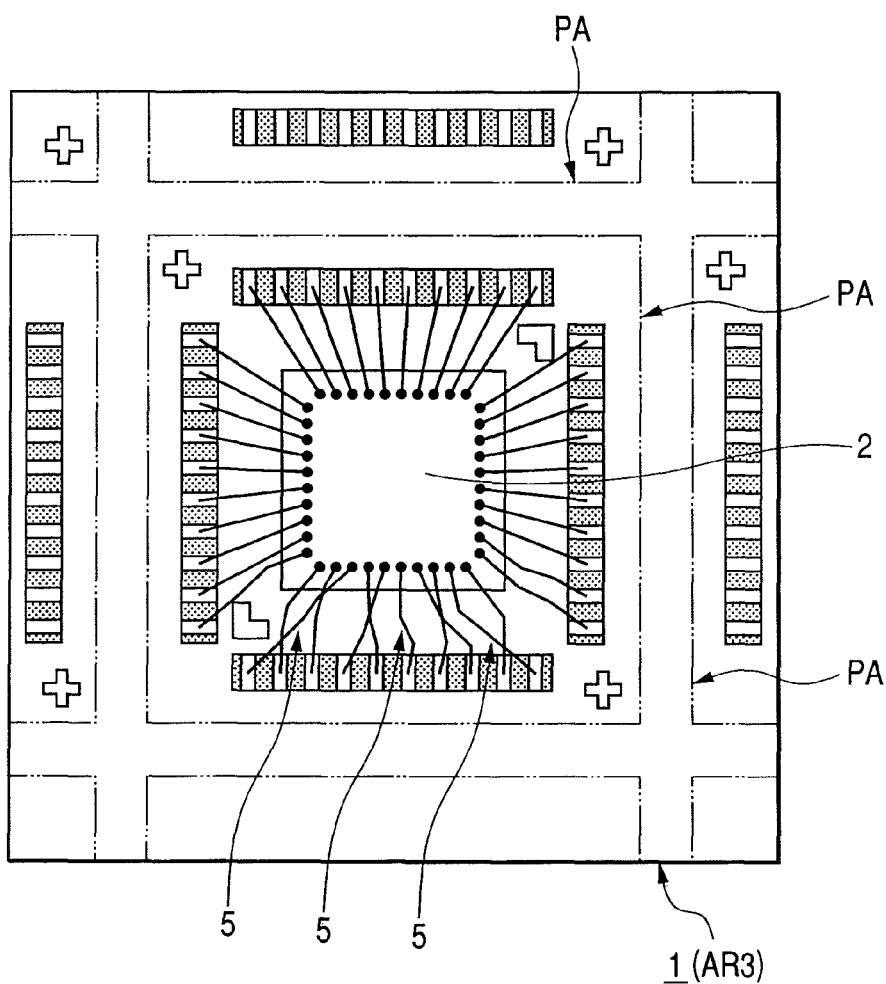
FIG. 26 is a mimetic diagram for explaining the problem in the manufacturing method of a conventional semiconductor device, and is a drawing showing the condition of the bonding wire after the molding of area AR3 shown in FIG. 24.

Conventionally, when a semiconductor device is produced by the manner same as the manufacturing method of a semiconductor device of the present First Embodiment, in said molding step, as shown in FIG. 15, exhaust holes 901 along the downstream side end portion 801a of said mold cavity 801 are, in general terms, the holes formed in the purpose of adsorption of said printed wiring board 1, and the number was also few. Therefore, for example, as indicated in FIG. 15, when air (bubble) 10 which arrived at the downstream side end portion 801a of said mold cavity 801 is going to escape to the exterior space through the region where mold clamping is performed, an interval of exhaust holes 901 being wide, it was generated that it did not arrive at the exhaust hole 901. As a result, the inventors found out that, as shown in FIG. 16, mold resin 6 was filled with the condition in which the air (bubble) 10 remained, i.e., the condition that the printed circuit board 1 changed (upheaved), and big deformation of bonding wire 5 as shown in FIG. 26 had taken place. Then, when inventors originally examined and compared the failure generation rate of occurrence as shown in FIG. 26 of the case using a conventional lower die and the failure generation rate of occurrence of the present First Embodiment, in other words, of the case using the lower die 9 as shown in FIG. 9, among regions (product region) PA to be cut out as a semiconductor device, it was understood that, whereas the failure generation rate of occurrence of the region that was the nearest to the downstream side end portion 801a of the said mold cavity was about 30% in the case using a conventional lower die, the failure generation rate of occurrence of the case using the lower die 9 as shown in FIG. 9 was lower than 1%. As a result of this as well, it is thought that the manufacturing method of a semiconductor device of the present First Embodiment is effective as a manner to improve manufacture yield preventing big deformation of said bonding wire 5.

As discussed above, according to the manufacturing method of a semiconductor device of the present First Embodiment, by forming exhaust holes in the lower die 9 of said metal mold along the end portion 801a of said mold cavity 801 opposing the gate 802 to pour mold resin 6 as many as possible, flatness of the protective insulation film 103 of said printed wiring board 1 being high, even when air (bubble) 10 was left behind in the adsorption face when it was adsorbed to the lower die 9, said air 10 left behind can be easily discharged to the exterior space of said lower die 9, and big deformation of a bonding wire 5 can be prevented.

In addition, the failure such as a short circuit and an open circuit by the deformation of bonding wires 5 can be reduced, and the manufacture yield of the semiconductor device can be improved.

Figure 17:
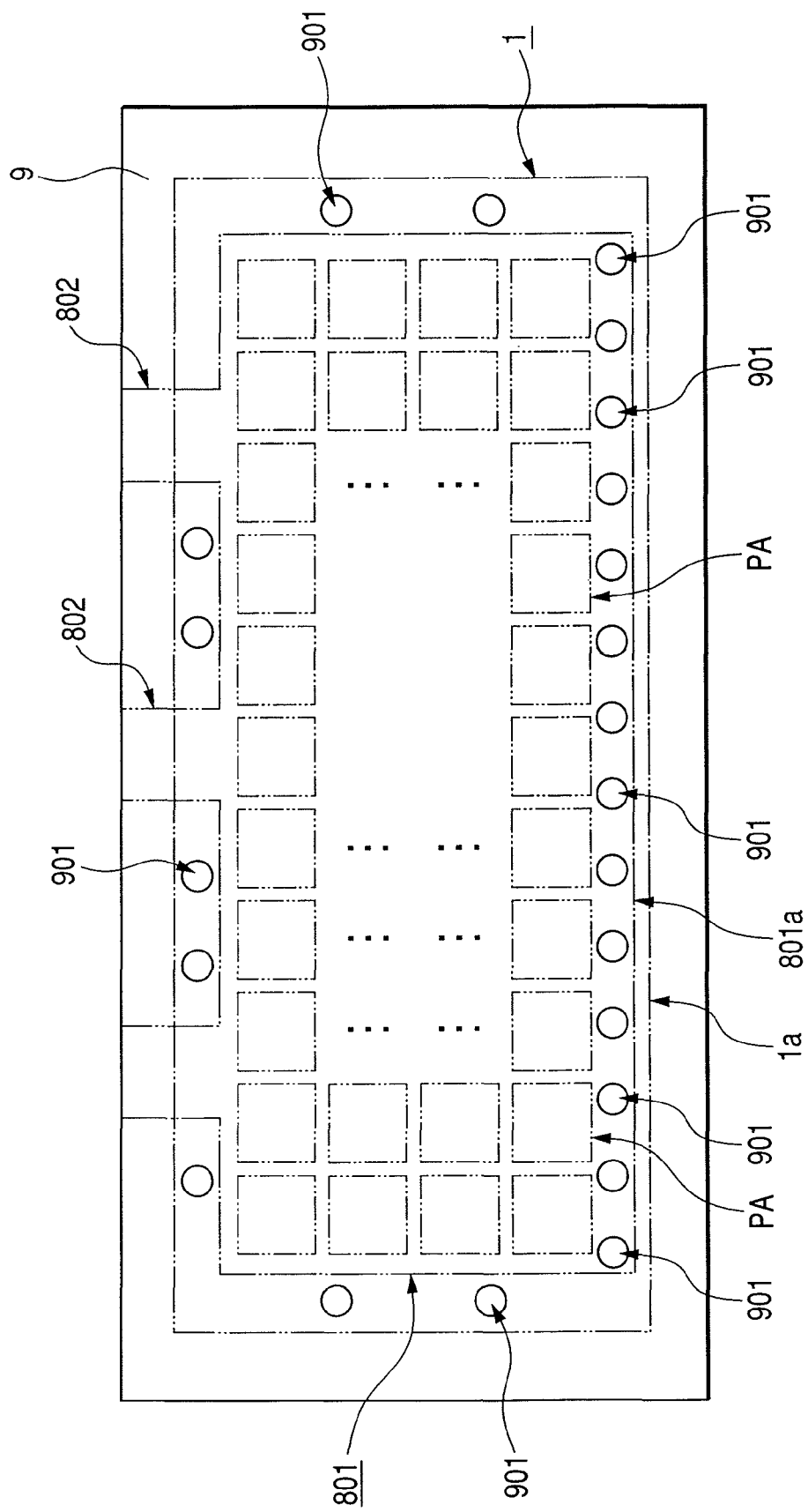
FIG. 17 is a mimetic diagram for explaining the modification of the manufacturing method of the semiconductor device of First Embodiment, and is a drawing of the lower die explaining the first modification.
Figure 18:
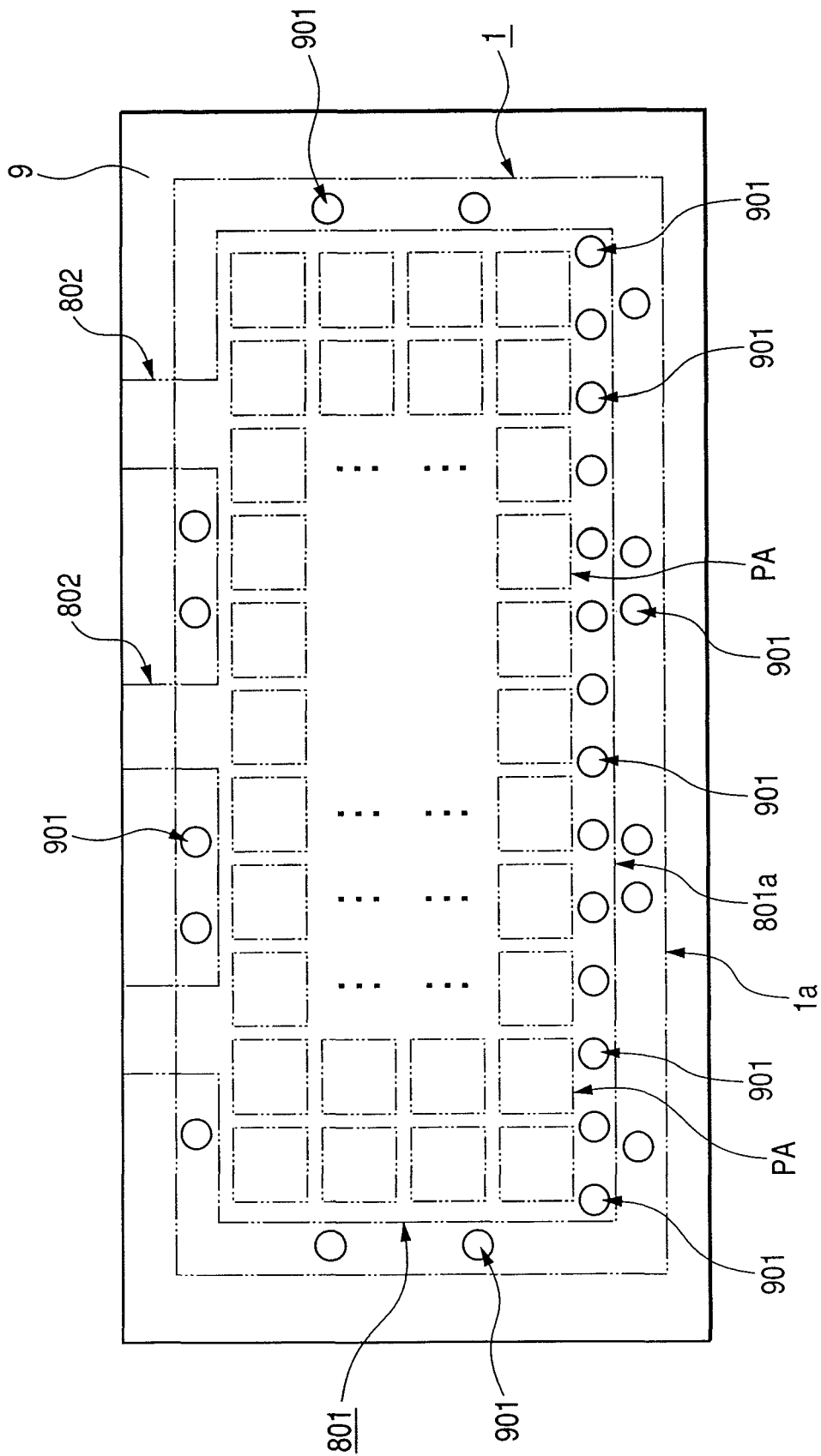
FIG. 18 is a mimetic diagram for explaining the modification of the manufacturing method of the semiconductor device of First Embodiment, and is a drawing of the lower die explaining the second modification.

FIG. 17 and FIG. 18 are mimetic diagram for explaining the modification of the manufacturing method of the semiconductor device of First Embodiment, FIG. 17 is a drawing of the lower die explaining the first modification, and FIG. 18 is a drawing of the lower die explaining the second modification.

In the manufacturing method of a semiconductor device of the present First Embodiment, as indicated in FIG. 9, the example that the air 10 left behind in the adsorption face of said printed wiring board 1 and the lower die 9 is exhausted using an exhaust hole 901 provided outside of the downstream side end portion 801a of the mold cavity 8, in other words, in the region where mold clamping is performed, was explained, but the place of an exhaust hole 901 is not limited to this, and the place may be where the air 10 which arrived at the downstream side end portion 801a of said mold cavity 8 can easily run away to the exterior space of said lower die 9.

As for an example of such a lower die 9, for example, as shown in FIG. 17, a lower die 9 providing exhaust holes 901 in the gate 802 side than the downstream side end portion 801a of said mold cavity 801, is conceivable. Then, since said exhaust hole 901 is in the region overlapping said mold cavity 801, in other words, in the region where mold resin 6 is formed, compared to the case that it is in the region where the mold clamping is performed, it is easy to discharge air 10 which arrived at the downstream side end portion 801a of said mold cavity to the exterior space of the lower die 9. But, when transfer molding using said metal mold is performed, a trace of an exhaust hole 901 is left in the back surface of the chip mounted surface of said printed wiring board 1. Therefore, said exhaust hole 901 is, as indicated in FIG. 17, preferable to be provided at the gate 802 side than the downstream side end portion 801a of said mold cavity 801 and in the region between it and the edge of the product region PA which is the nearest to said downstream side end portion 801a.

In addition, then, it is preferable for said exhaust holes 901 to be provided as many as possible, and particularly it is preferred to be provided with narrower interval than the interval GB of said product region PA of said printed wiring board 1 or the width GC of the product region PA. Then, in exhaust holes 901, all holes may be connected to an evacuation device, or only some holes being connected to an evacuation device, and the remaining holes may only be holes merely connecting the adsorption face and the exterior space of the lower die 9.

In addition, as for the lower die represented in FIG. 9 and FIG. 17, said exhaust holes 901 had both the function to make adsorb said printed wiring board 1 and the function to discharge air 10 which arrived at the downstream side end portion 801a of said mold cavity, but not limited to this, for example, as shown in FIG. 18, the lower die 9 may comprise a hole 901 same as before to make adsorb the printed wiring board 1 at the outside of said downstream side end portion 801a, in other words, in the region where mold clamping is performed and a hole to discharge air 10 which arrived at said downstream side end portion 801a in gate 802 side than said downstream side end portion 801a.

Second Embodiment

Figure 19:
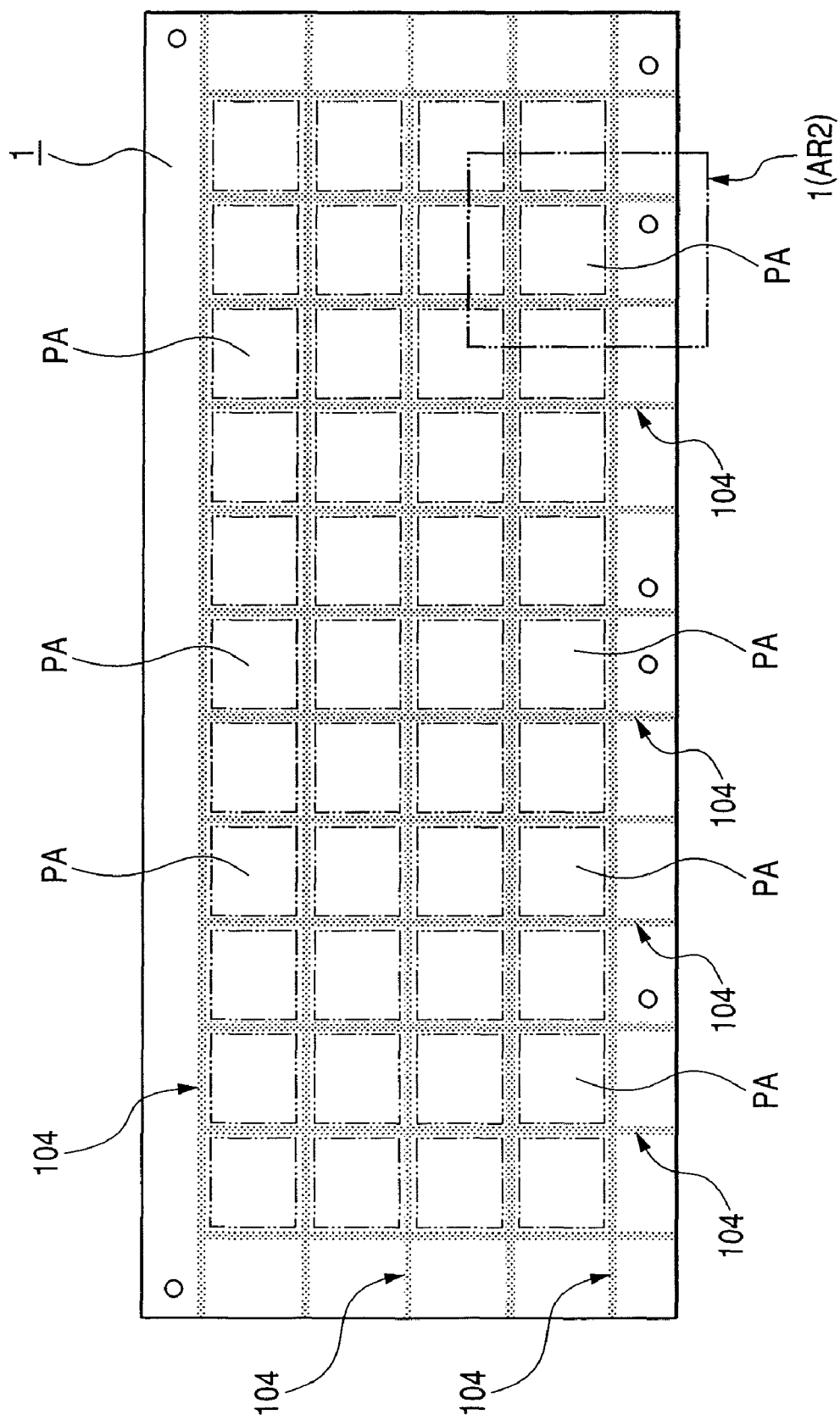
FIG. 19 is a mimetic diagram for explaining the manufacturing method of the semiconductor device of Second Embodiment by the present invention, and is the drawing which looked at the printed circuit board used for manufacture of a semiconductor device from the back surface of a chip mounting surface.
Figure 20:
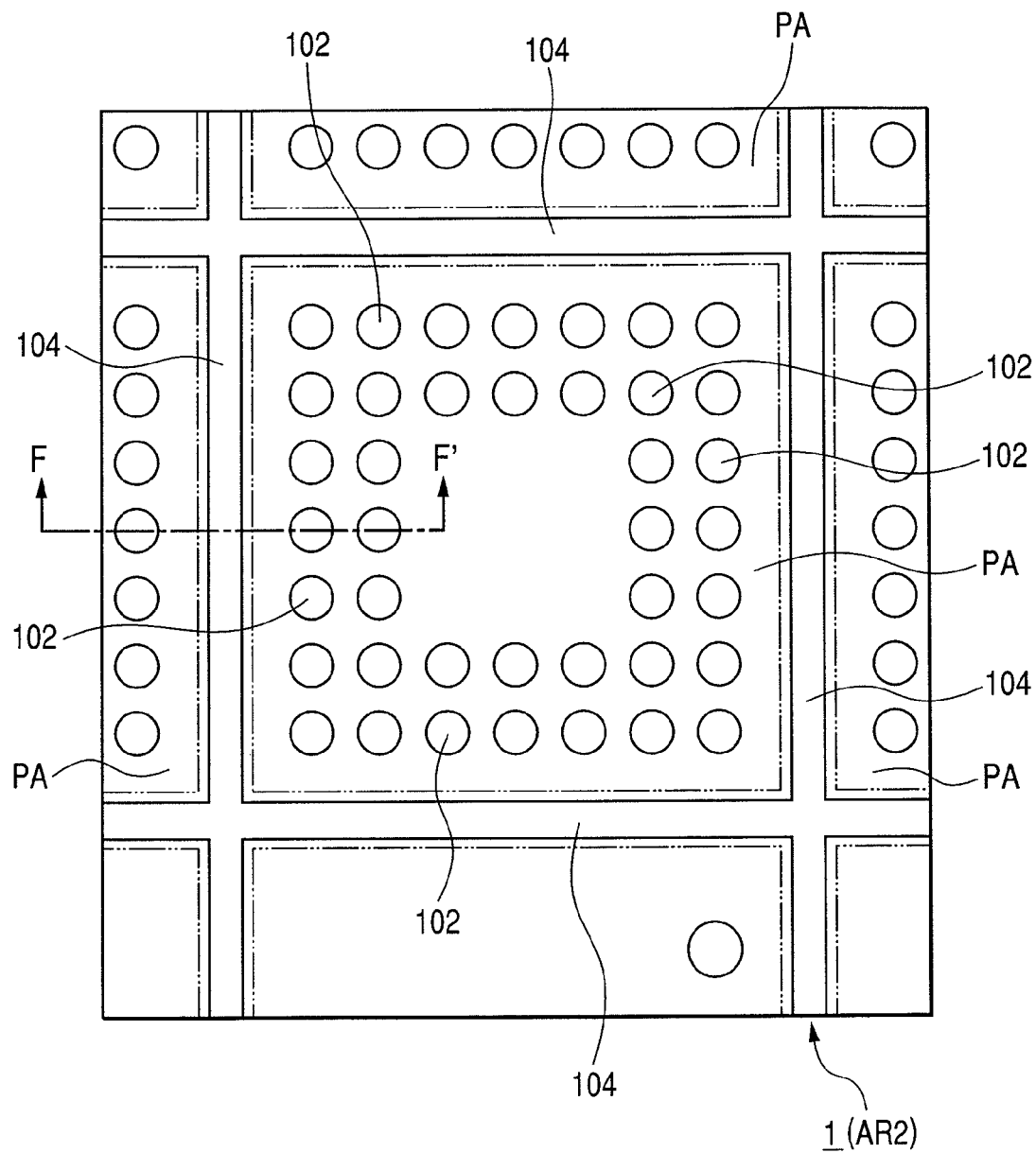
FIG. 20 is a mimetic diagram for explaining the manufacturing method of the semiconductor device of Second Embodiment by the present invention, and is an enlarged view of area AR2 of FIG. 19.
Figure 21:
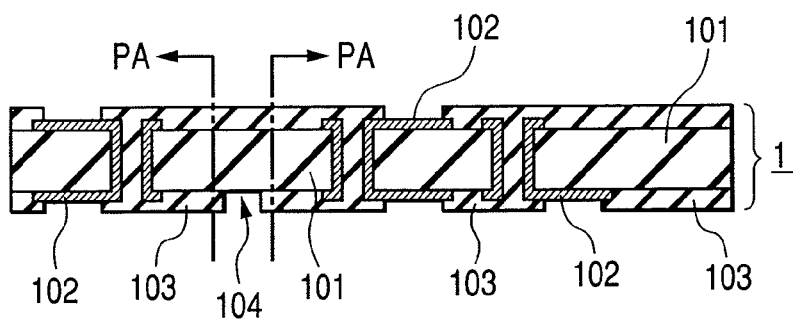
FIG. 21 is a mimetic diagram for explaining the manufacturing method of the semiconductor device of Second Embodiment by the present invention, and is a F-F' line sectional view of FIG. 20.

FIG. 19 through FIG. 21 are mimetic diagrams for explaining the manufacturing method of the semiconductor device of Second Embodiment by the present invention, FIG. 19 is the drawing which looked at the printed circuit board used for manufacture of a semiconductor device from the back surface of a chip mounting surface, FIG. 20 is an enlarged view of area AR2 of FIG. 19, and FIG. 21 is a F-F' line sectional view of FIG. 20. In addition, in FIG. 19 through FIG. 21, 104 is a groove.

In the manufacturing method of a semiconductor device of the present Second Embodiment, as a manner to exhaust air 10 which arrived at the downstream side end portion 801a of said mold cavity 801 to the exterior space of the lower die 9, as shown in FIG. 19 through FIG. 21, in the region (dicing region) outside of the region (product region) PA to be cut out as a semiconductor device, of the back surface of the chip mounted surface of said printed wiring board 1, a groove 104 reaching a side of said printed wiring board 1 is formed. Then, since the configuration of the chip mounted surface of said printed wiring board 1 may be, for example, the configuration that is represented in FIG. 5, detailed description is omitted. In addition, although omitted in FIG. 19, in said product region PA on said printed wiring board 1, conductor patterns 102 are assumed to be arranged in an array manner. In addition, the conductor patterns 102 of the chip mounted surface and the back surface of said printed wiring board 1, are assumed to be electrically connected.

In addition, since the manufacturing method of the printed wiring board represented in FIG. 19 through FIG. 21 is, roughly saying, preferable in the procedure same as the double-sided printed wiring board of the above First Embodiment, detailed description on the procedure is omitted.

In addition, when the printed wiring board 1 to be used in the manufacturing method of a semiconductor device of the present Second Embodiment 2 is produced, for example, the film-like resist of the back surface of said chip mounted surface being exposed and developed after sticking a film-like resist with heat and pressure by the manner represented in FIG. 6, in the step removing resist on the conductor patterns arranged in an array manner, in other words, in the step forming said protective insulation membrane 103, a groove reaching a side of said printed wiring board 1 is formed the resist on the dicing region also being removed.

Figure 22:
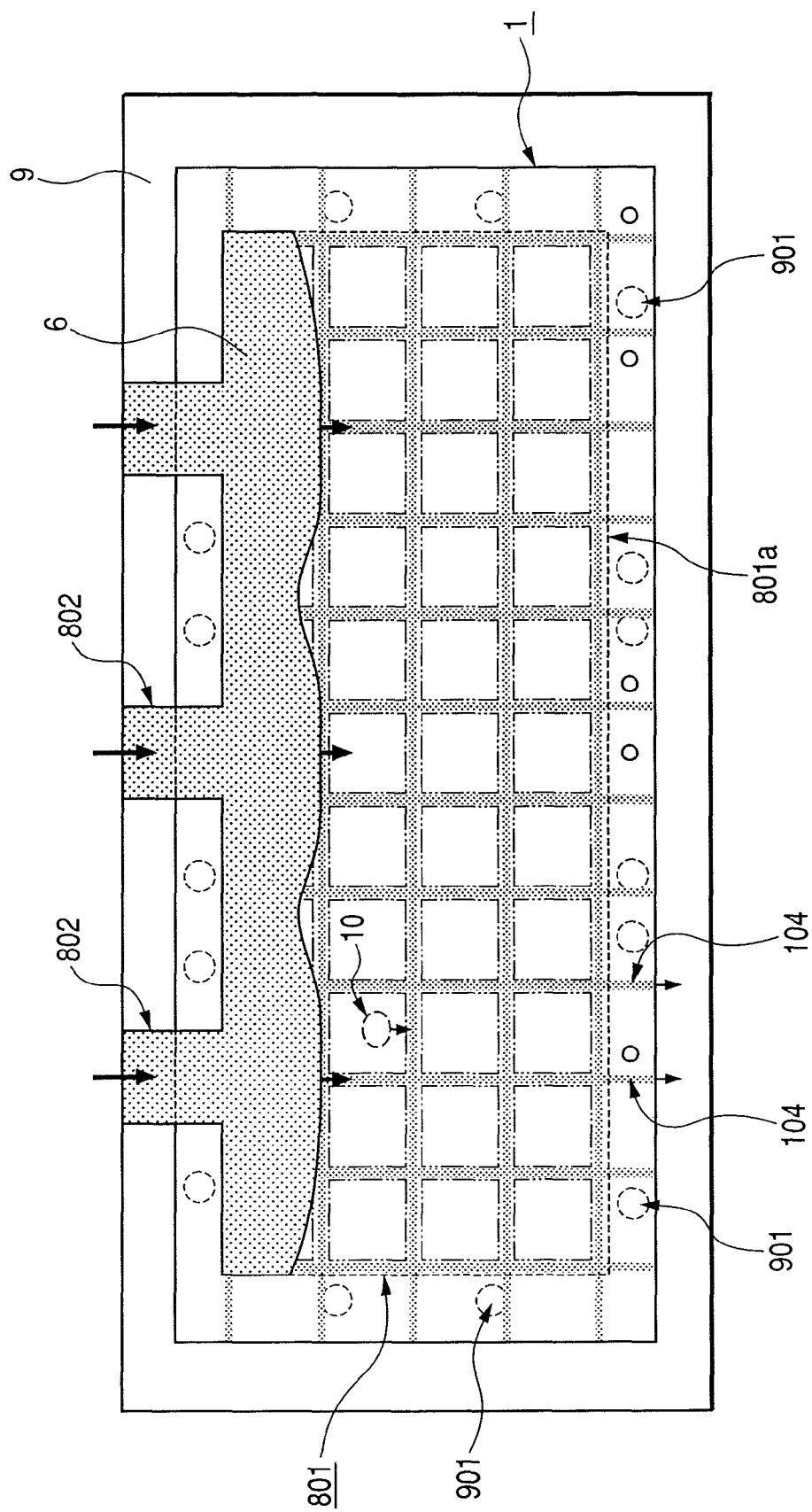
FIG. 22 is a mimetic diagram for explaining the operation effect of the manufacturing method of the semiconductor device of Second Embodiment, and is a drawing showing the situation in the mold cavity when pouring in mold resin.
Figure 23:
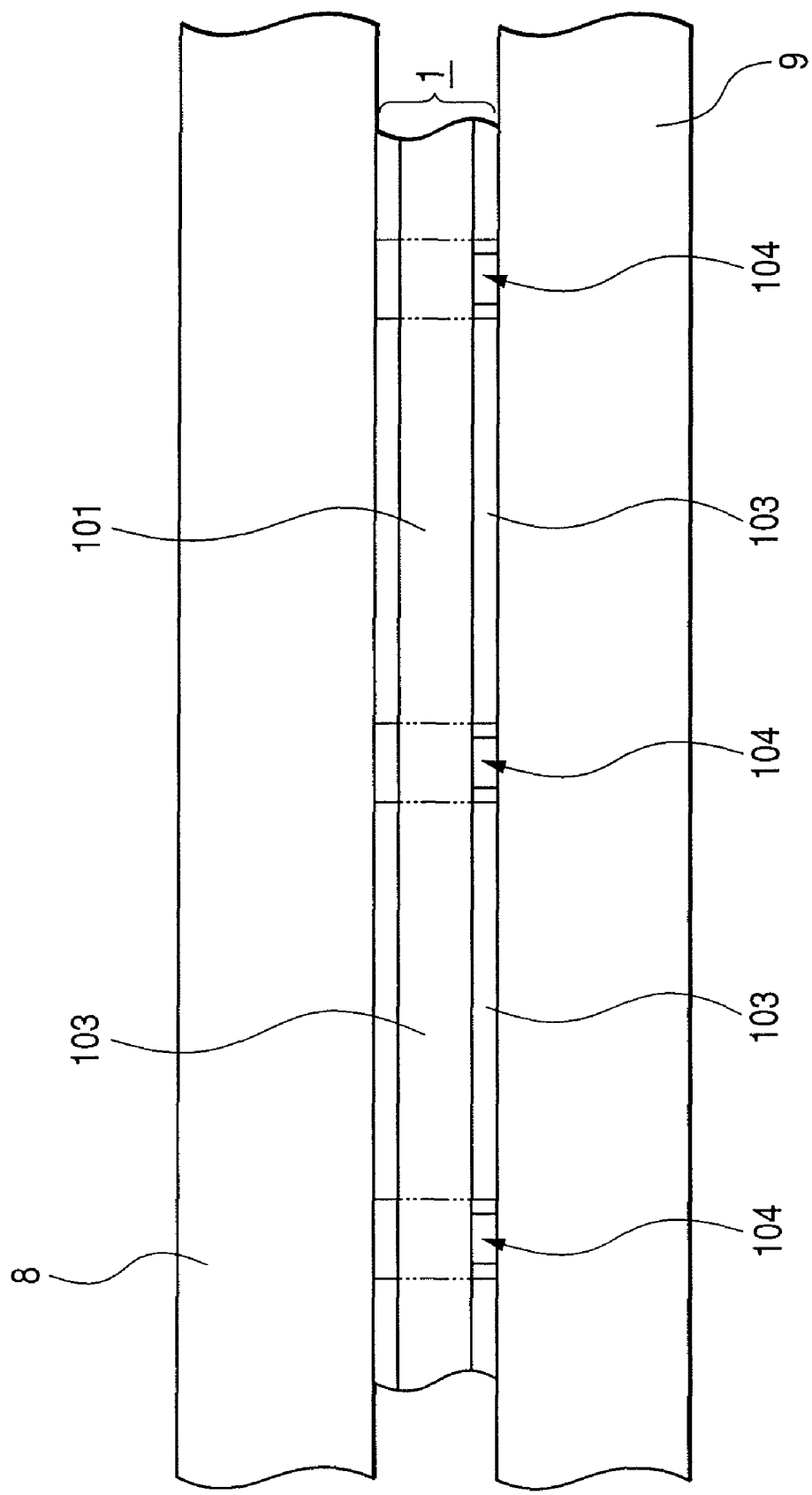
FIG. 23 is a mimetic diagram for explaining the operation effect of the manufacturing method of the semiconductor device of Second Embodiment, and is the side view which looked at the metal mold of FIG. 22 from the bottom of the page.
Figure 24:
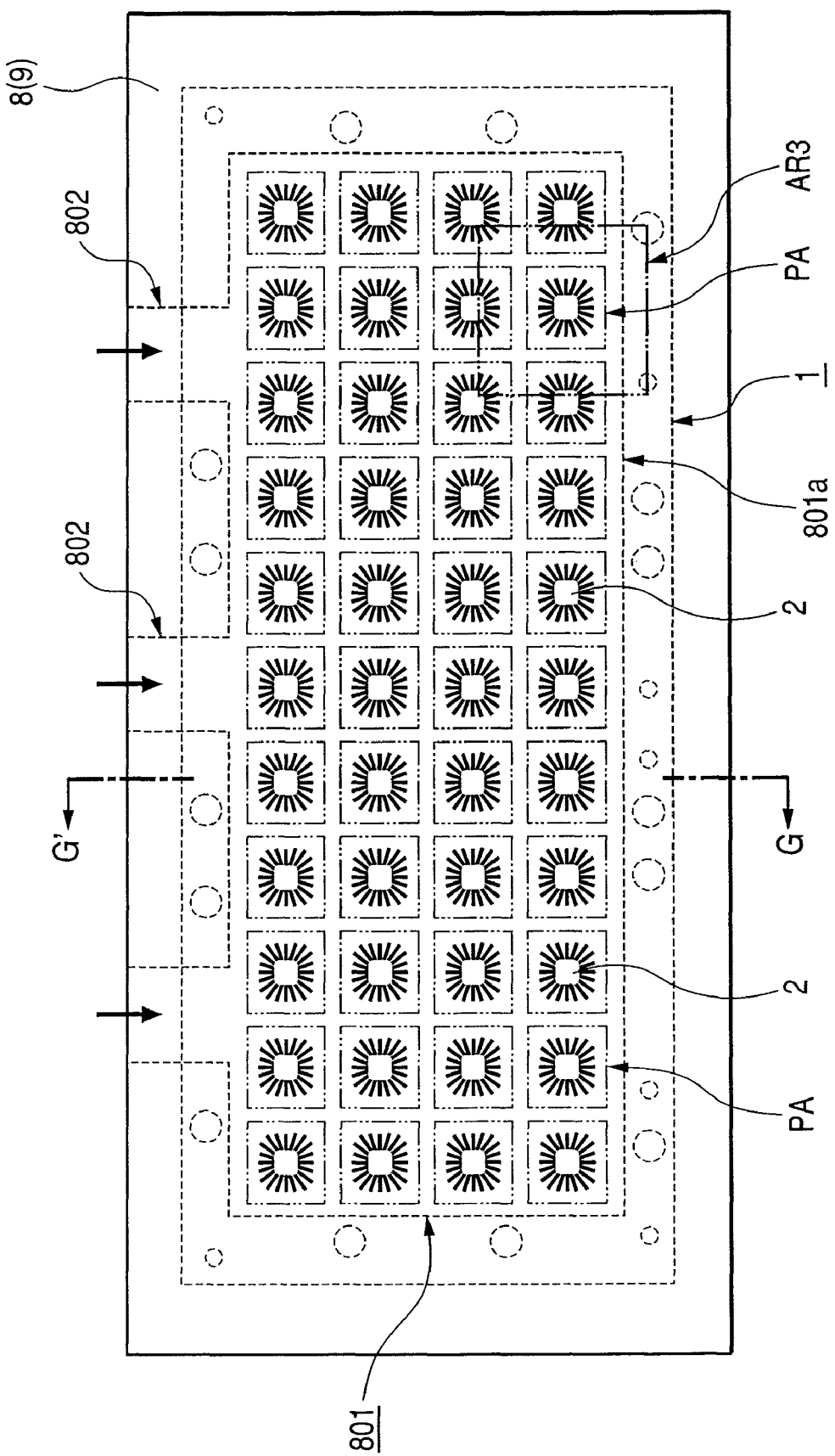
FIG. 24 is a mimetic diagram for explaining the problem in the manufacturing method of a conventional semiconductor device, and is the drawing which looked at the condition of the metal mold of the step molded with mold resin from the chip mounting side.
Figure 25:
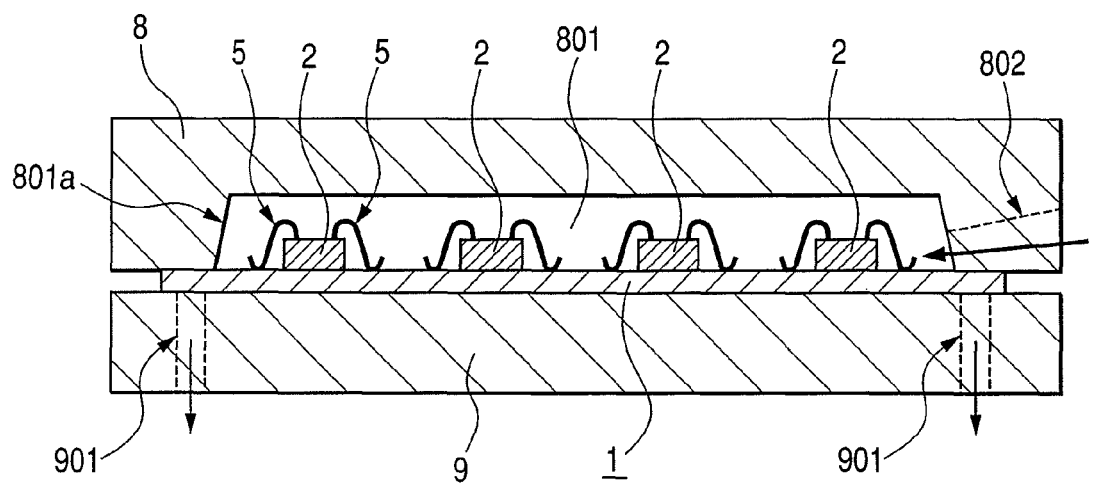
FIG. 25 is a mimetic diagram for explaining the problem in the manufacturing method of a conventional semiconductor device, and is a G-G' line sectional view of FIG. 24.

FIG. 22 and FIG. 23 are mimetic diagrams for explaining the operation effect of the manufacturing method of the semiconductor device of Second Embodiment, FIG. 22 is a drawing showing the situation in the mold cavity when pouring in mold resin, and FIG. 23 is the side view which looked at the metal mold of FIG. 22 from the bottom of the page.

In the manufacturing method of a semiconductor device of the present Second Embodiment, the printed wiring board 1 represented in FIG. 19 through FIG. 21 is used. Then, since the step mounting the semiconductor chip 2 and electrically connecting the conductor patterns 102 of the electrodes 201 of said semiconductor chip 2 and the printed wiring board 1 with bonding wires 5, is the same as the conventional manufacturing method, detailed description is omitted.

In addition, since the step performing mold clamping to the printed wiring board 1 mounting the semiconductor chip 2 with said metal mold and pouring mold resin 6 into the mold cavity 801, is also the same as the conventional production method, detailed description is omitted.

But, in the manufacturing method of a semiconductor device of the present Second Embodiment, the groove 104 is formed on the back surface of the chip mounted surface of said printed wiring board 1. Therefore, so that one of the sides at which the groove 104 arrives among the sides of said printed wiring board 1, as shown in FIG. 22, comes to the vicinity of the downstream side end portion 801a of said mold cavity 801, mold clamping is performed to said printed wiring board 1. Then, in the face (adsorption face) to contact with the lower die 9 of said printed wiring board 1, said groove 104 is formed. Therefore, as shown in FIG. 23, there will be an exhaust hole made of the groove 104 of said printed wiring board 1 and said lower die 9 between said printed wiring board 1 and the adsorption face of said lower die 9 with the state that mold clamping is performed.

Here, on explaining operation effect of the manufacturing method of a semiconductor device of the present Second Embodiment, when said printed wiring board 1 was made adsorb to said lower die 9, for example, as shown in FIG. 22, the case that the air (bubble) 10 is left behind is contemplated in the region (product region) PA to be cut out as said semiconductor device. Then, when the mold resin 6 is poured in the mold cavity 801 from said gate 802, said air 10 left behind moves towards the downstream side end portion 801a of said mold cavity 801 by inflow pressure of said mold resin 6. Then, said air 10 left behind, going out from the end portion of said product region PA to the outside (dicing region), arrives at the groove 104. And, when said mold resin 6 continues being poured, the air 10 which arrived at said groove 104, going along said groove 104, reaches the side of said printed wiring board 1 of the vicinity of the downstream side end portion 801a of said mold cavity 801, and can run away to the exterior space of said lower die 9. Therefore, as indicated in FIG. 14, the air 10 which moved to said downstream side end portion 801a being discharged to the exterior space of said lower die, with the state that said printed wiring board 1 does not transform with said air (bubble) 10, said mold resin 6 can be filled in the mold cavity. As for said groove 104, in order to exhaust said air (bubble) 10 smoothly, through the region where mold clamping was performed to the printed wiring board 1 with the upper die 8 and the lower die 9, it is preferable for it to be connected to an evacuation device or to be opened wide in exterior space (atmospheric pressure).

As discussed above, according to the manufacturing method of a semiconductor device of the present Second Embodiment, by providing a groove 104 arriving at a side of said printed wiring board 1 on the back surface of the chip mounted surface of said printed wiring board 1, flatness of the protective insulation film 103 of said printed wiring board 1 being high, even when air (bubble) 10 was left behind in the adsorption face when it was adsorbed to the lower die 9, the air 10 left behind can be let go easily to the exterior space (atmospheric pressure) of the lower die 9 or to an evacuation system, and big deformation of a bonding wire 5 can be prevented.

In addition, the failure such as a short circuit and an open circuit by the deformation of bonding wire 5 can be reduced, and manufacture yield of the semiconductor device can be improved.

In addition, in the manufacturing method of a wiring board of the present Second Embodiment, the groove 104 reaching three sides of said printed wiring board 1 was provided as indicated in FIG. 19, but without limiting to this, it may be a groove reaching only one side at which mold clamping is performed in the vicinity of the downstream side end portion 801a of said mold cavity 801. In addition, in the manufacturing method of a wiring board of the present Second Embodiment, the groove 104 in the manner of grating was provided as shown in FIG. 19, but without limiting to this, it may be only a parallel groove extending along inflow direction of mold resin 6, in other words, in direction from the gate 802 side to the downstream side end portion 801a.

As things mentioned above, the present invention was concretely explained based on an above embodiment, but the present invention is not limited by above embodiments, variations and modifications may be made, of course, in various ways in the limit that does not deviate from the gist.

What is claimed is:

1. A method of manufacturing a semiconductor device, comprising the steps of:
   (a) providing a wiring board having a plurality of product regions, and a plurality of semiconductor chips mounted on the plurality of product regions, respectively,
      wherein each of the plurality of product regions has a main surface, a plurality of first conductor patterns formed on the main surface, a first insulating layer formed over the plurality of first conductor patterns such that a part of each of the plurality of first conductor patterns is exposed from the first insulating layer, a back surface opposing to the main surface, a plurality of second conductor patterns formed on the back surface, and a second insulating layer formed over the plurality of second conductor patterns such that a part of each of the plurality of second conductor patterns is exposed from the second insulating layer,
      wherein the plurality of first conductor patterns are electrically connected with the plurality of second conductor patterns via a plurality of through holes, respectively, and
      wherein the first and second insulating layers are comprised of a film type material, respectively;
   (b) disposing the wiring board on a main surface of a lower die such that all of the plurality of semiconductor chips are arranged inside of a cavity formed on a main surface of an upper die in a plane view,
      wherein the main surface of the upper die is facing in a direction opposite to that of the main surface of the lower die,
      wherein the cavity has pairs of first edges, and pairs of second edges intersecting with the first edges,
      wherein a plurality of gate portions are formed along one of the first edges such that each of the plurality of gate portions connects with the cavity,
      wherein a plurality of first holes are formed on the main surface of the lower die such that the plurality of first holes are arranged along the first edges of the cavity in a plane view,
      wherein a pitch of the plurality of first holes is narrower than that of the plurality of product regions, and
      wherein the number of the plurality of first holes arranged along the one of the first edges is less than that of the plurality of first holes arranged along another of the first edges;
   (c) clamping a peripheral portion of the wiring board by the upper die and the lower die,
      wherein the peripheral portion of the wiring board is outside of the plurality of product regions in a plane view;
   (d) injecting molding resin into the cavity via the plurality of gate portions;
   (e) opening the upper die and the lower die, and removing the wiring board from between the upper die and the lower die; and
   (f) cutting a plurality of dicing areas between the plurality of product regions of the wiring board.

2. The method of manufacturing the semiconductor device according to claim 1, wherein the plurality of semiconductor chips are electrically connected with the plurality of first conductor patterns via a plurality of wires, respectively.

3. The method of manufacturing the semiconductor device according to claim 1, wherein the plurality of first holes formed on the lower die are arranged inside of the peripheral portion of the wiring board in a plane view.

4. The method of manufacturing the semiconductor device according to claim 1, wherein in the step of (d), the molding resin is injected into the cavity while absorbing the back surface of the wiring board via the plurality of first holes.

5. The method of manufacturing the semiconductor device according to claim 1, wherein the first and second insulating layer are formed over the main surface and the back surface of the wiring board by heating and pressing the insulating layer with a roller, respectively.

6. The method of manufacturing the semiconductor device according to claim 1, wherein the plurality of first holes are an exhaust hole, respectively.

7. A method of manufacturing a semiconductor device, comprising the steps of:
   (a) providing a wiring board having a plurality of product regions, and a plurality of semiconductor chips mounted on the plurality of product regions, respectively,
      wherein each of the plurality of product regions has a main surface, a plurality of first conductor patterns formed on the main surface, a first insulating layer formed over the plurality of first conductor patterns such that a part of each of the plurality of first conductor patterns is exposed from the first insulating layer, a back surface opposing to the main surface, a plurality of second conductor patterns formed on the back surface, and a second insulating layer formed over the plurality of second conductor patterns such that a part of each of the plurality of second conductor patterns is exposed from the second insulating layer,
      wherein the plurality of first conductor patterns are electrically connected with the plurality of second conductor patterns via a plurality of through holes, respectively, and
      wherein the first and second insulating layers are comprised of a film type material, respectively;
   (b) disposing the wiring board on a main surface of a lower die such that all of the plurality of semiconductor chips are arranged inside of a cavity formed on a main surface of an upper die in a plane view,
      wherein the main surface of the upper die is facing in a direction opposite to that of the main surface of the lower die,
      wherein the cavity has pairs of first edges, and pairs of second edges intersecting with the first edges,
      wherein a plurality of gate portions are formed along one of the first edges such that each of the plurality of gate portions connects with the cavity,
      wherein a plurality of first holes are formed on the main surface of the lower die such that the plurality of first holes are arranged along the first edges of the cavity in a plane view, and
      wherein a pitch of the plurality of first holes is narrower than that of the plurality of product regions;
   (c) clamping a peripheral portion of the wiring board by the upper die and the lower die,
      wherein the peripheral portion of the wiring board is outside of the plurality of product regions in a plane view;
   (d) injecting molding resin into the cavity via the plurality of gate portions;
   (e) opening the upper die and the lower die, and removing the wiring board from between the upper die and the lower die; and
   (f) cutting a plurality of dicing areas between the plurality of product regions of the wiring board.

* * * * *